US007354817B2

(12) United States Patent
Watanabe et al.

(10) Patent No.: US 7,354,817 B2
(45) Date of Patent: Apr. 8, 2008

(54) SEMICONDUCTOR DEVICE, MANUFACTURING METHOD THEREOF, AND CMOS INTEGRATED CIRCUIT DEVICE

(75) Inventors: Taketo Watanabe, Kawasaki (JP); Toshio Nomura, Kawasaki (JP); Shinichi Kawai, Kawasaki (JP); Takayuki Kawamata, Sendai (JP); Shigeo Satoh, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 81 days.

(21) Appl. No.: 11/300,274

(22) Filed: Dec. 15, 2005

(65) Prior Publication Data

US 2006/0091473 A1 May 4, 2006

Related U.S. Application Data

(62) Division of application No. 10/633,538, filed on Aug. 5, 2003, now Pat. No. 7,034,366.

(30) Foreign Application Priority Data

Aug. 19, 2002 (JP) ............... 2002-238554

(51) Int. Cl.
*H01L 21/8238* (2006.01)
(52) U.S. Cl. ............... 438/217; 438/276; 257/E21.444
(58) Field of Classification Search ............... 438/217, 438/276, 289, 526
See application file for complete search history.

(56) References Cited

U.S. PATENT DOCUMENTS 5,712,501 A   1/1998  Davies et al.

| 6,084,269 | A | 7/2000 | Davies et al. |
| 6,180,468 | B1 * | 1/2001 | Yu et al. ............... 438/297 |
| 6,406,963 | B2 * | 6/2002 | Woerlee et al. ........ 438/291 |
| 6,479,356 | B1 | 11/2002 | Matsuoka |
| 6,562,687 | B1 * | 5/2003 | Deleonibus et al. ...... 438/303 |

(Continued)

FOREIGN PATENT DOCUMENTS

JP          6-37309          2/1994

(Continued)

OTHER PUBLICATIONS

Notification of Reason(s) for Refusal dated Feb. 28, 2006 issued with respect to corresponding Japanese Patent Application No. 2002-238554.

*Primary Examiner*—Trung Dang
(74) *Attorney, Agent, or Firm*—Westerman, Hattori, Daniels & Adrian, LLP.

(57) ABSTRACT

A semiconductor device includes a semiconductor substrate. A gate electrode is formed on the semiconductor substrate via a gate insulating film. A source region and a drain region of a first conductivity type are formed on the first side and the second side of the gate electrode, respectively, in the semiconductor substrate. A punch-through stopper region of a second conductivity type is formed in the semiconductor substrate such that the second conductivity type punch-through stopper region is located between the source region and the drain region at distances from the source region and the drain region and extends in the direction perpendicular to the principal surface of the semiconductor substrate. The concentration of an impurity element of the second conductivity type in the punch-through stopper region is set to be at least five times the substrate impurity concentration between the source region and the drain region.

4 Claims, 32 Drawing Sheets

U.S. PATENT DOCUMENTS 6,998,318 B2 * 2/2006 Park .......................... 438/289

FOREIGN PATENT DOCUMENTS

| JP | 07-235673 A | 9/1995 |
| JP | 09-116154 A | 5/1997 |
| JP | 2002-535834 A | 10/2002 |
| WO | WO 00/42647 A1 | 7/2000 |

* cited by examiner

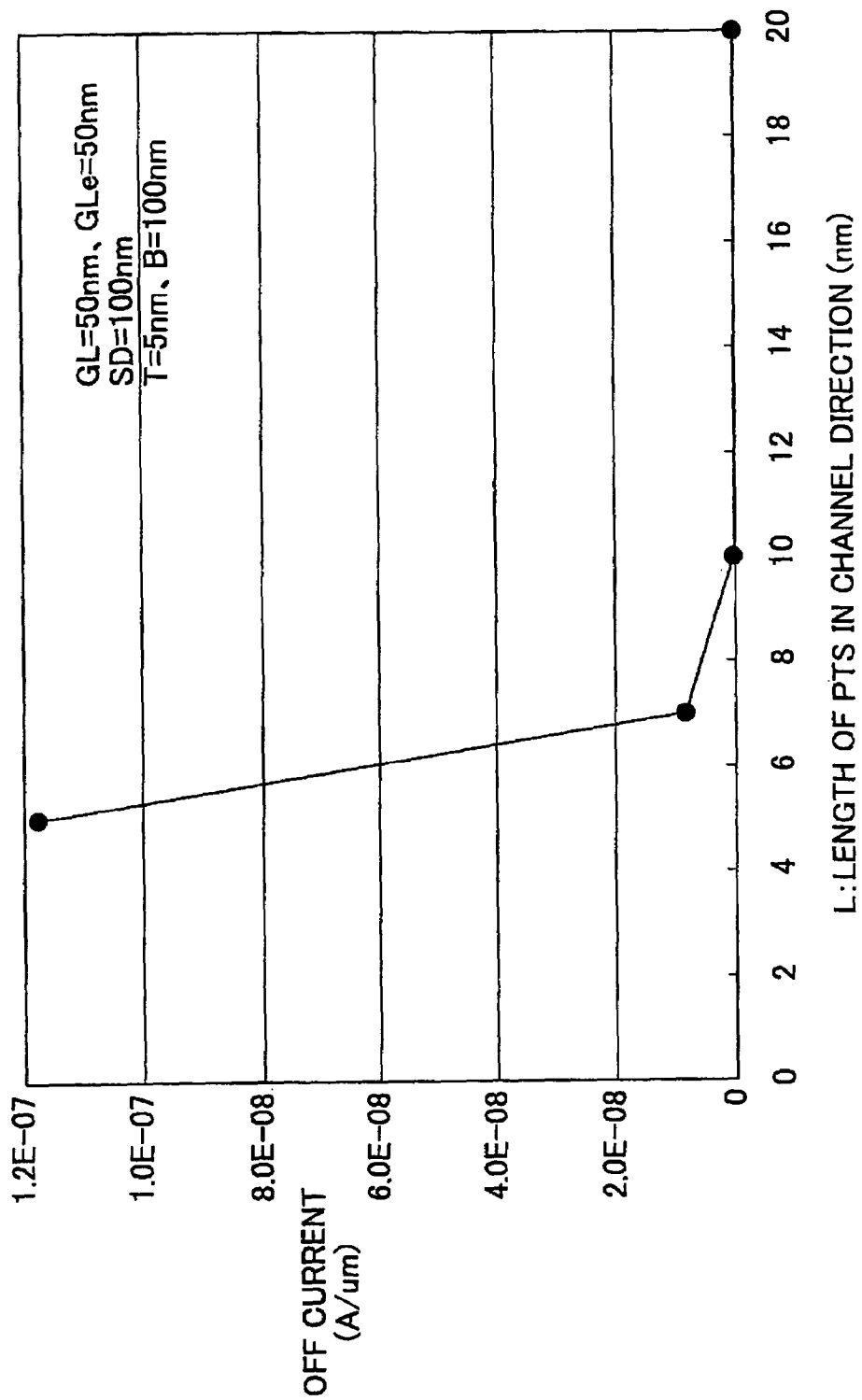

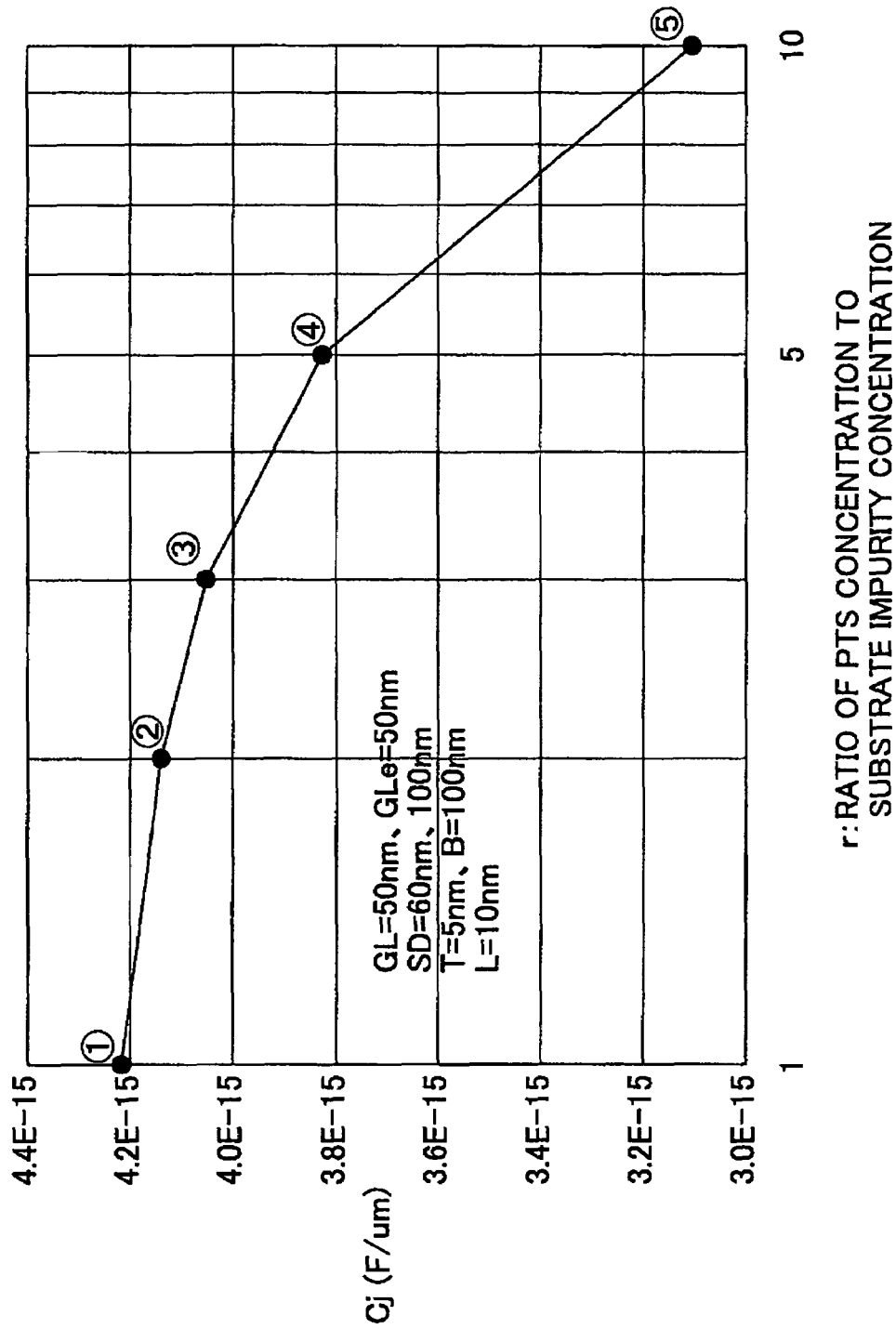

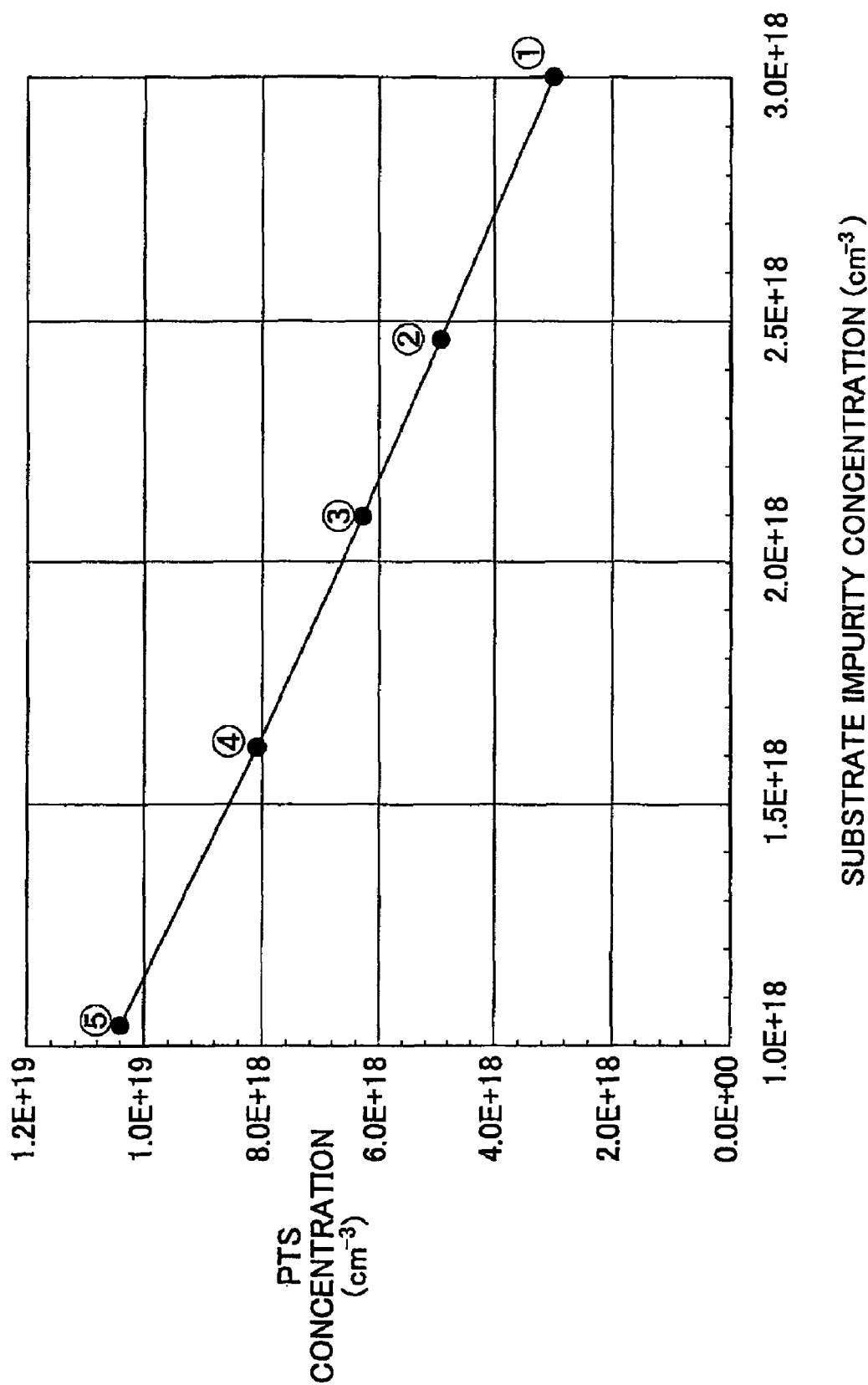

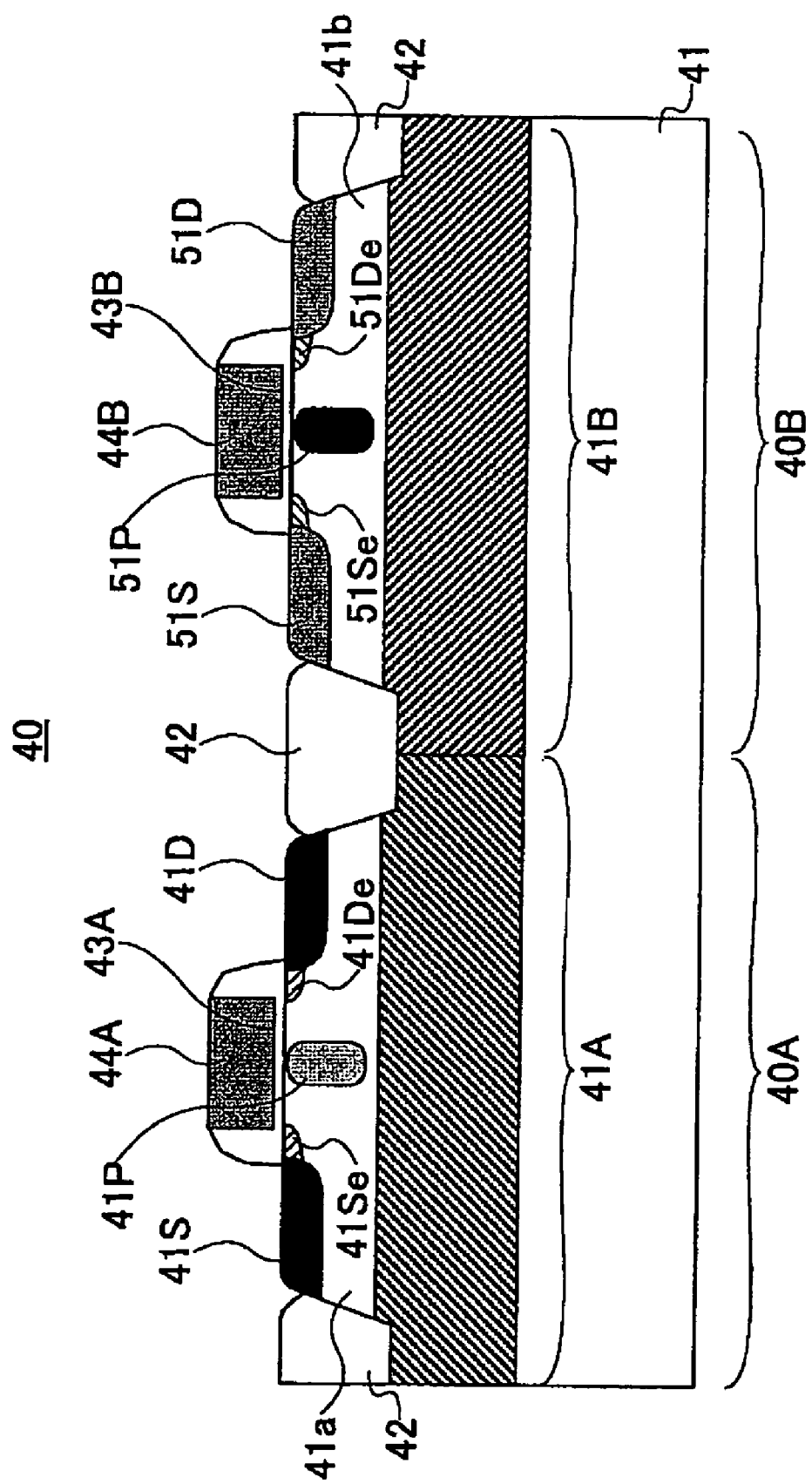

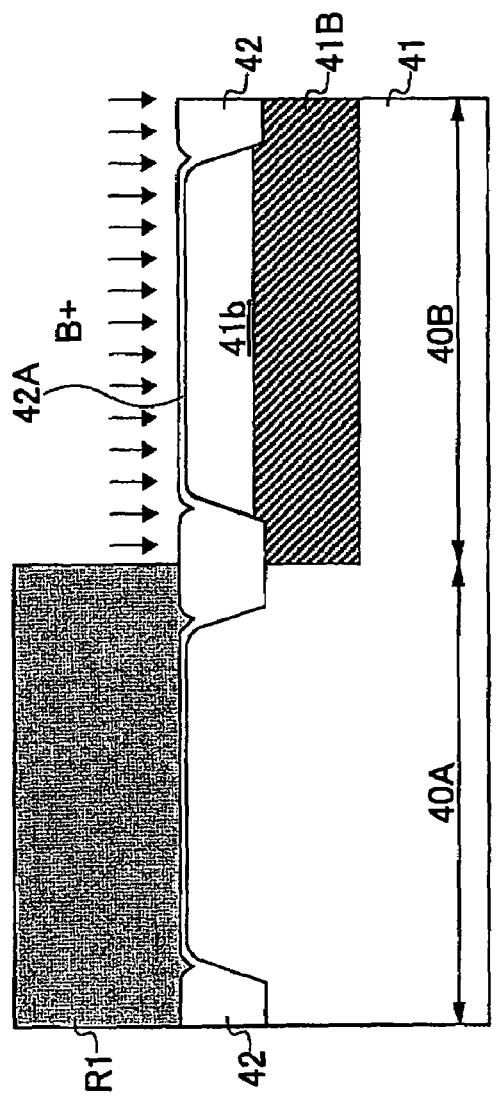
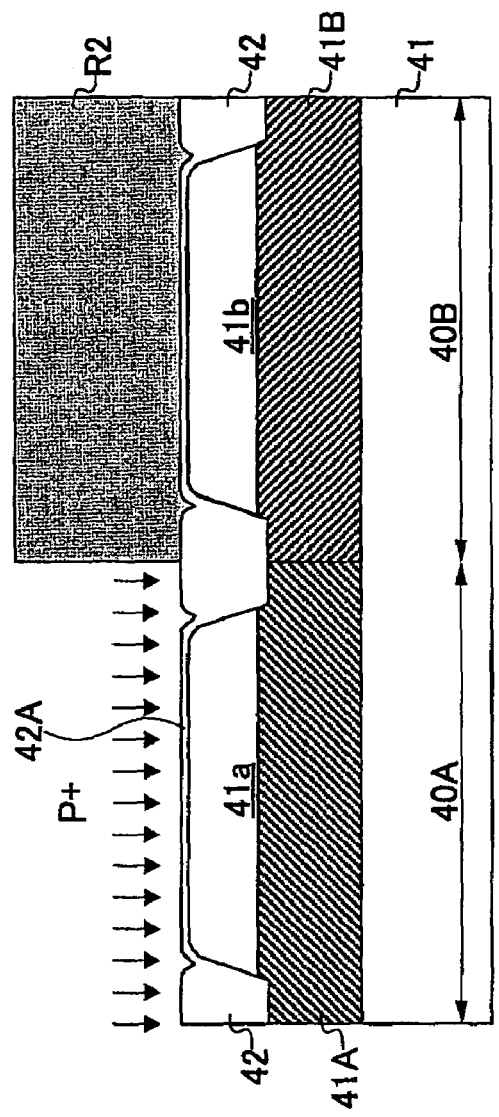
FIG.13A
FIG.13B

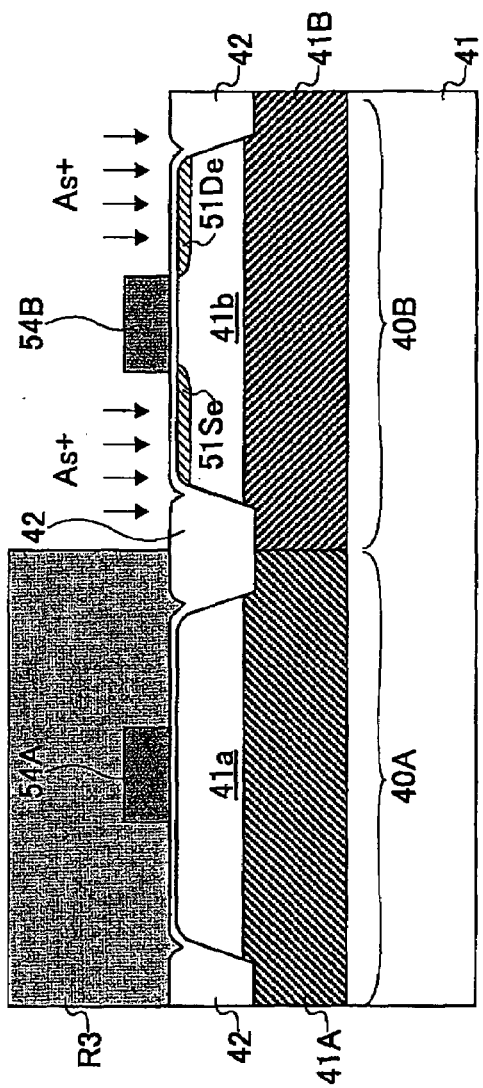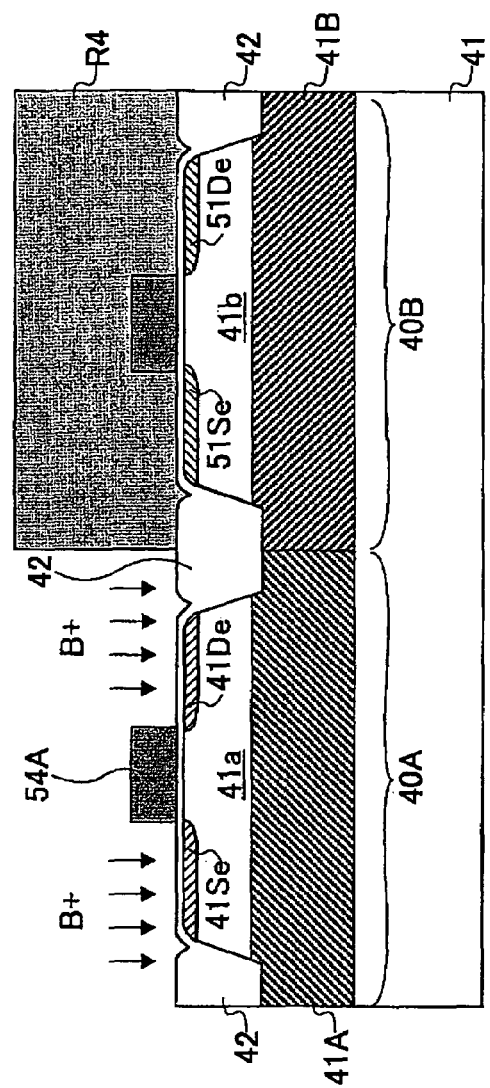
FIG.13D
FIG.13E

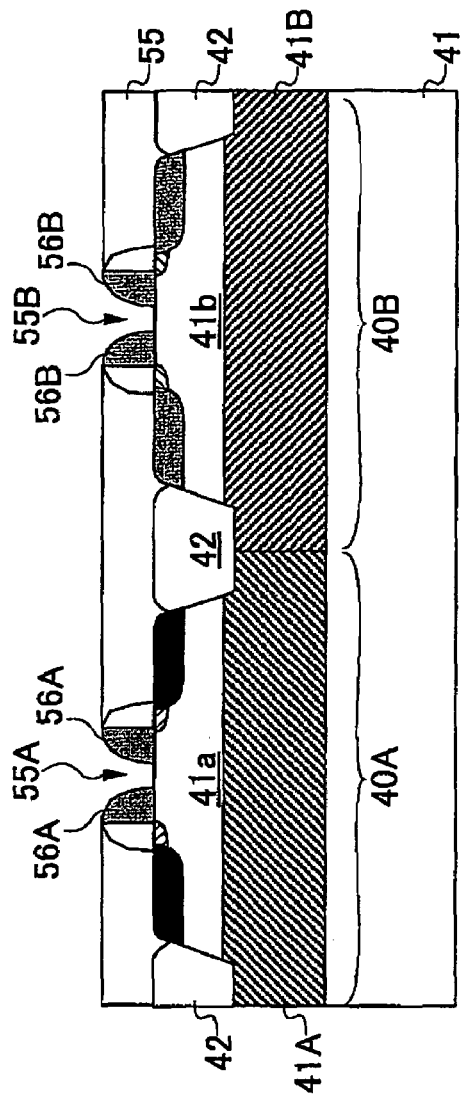
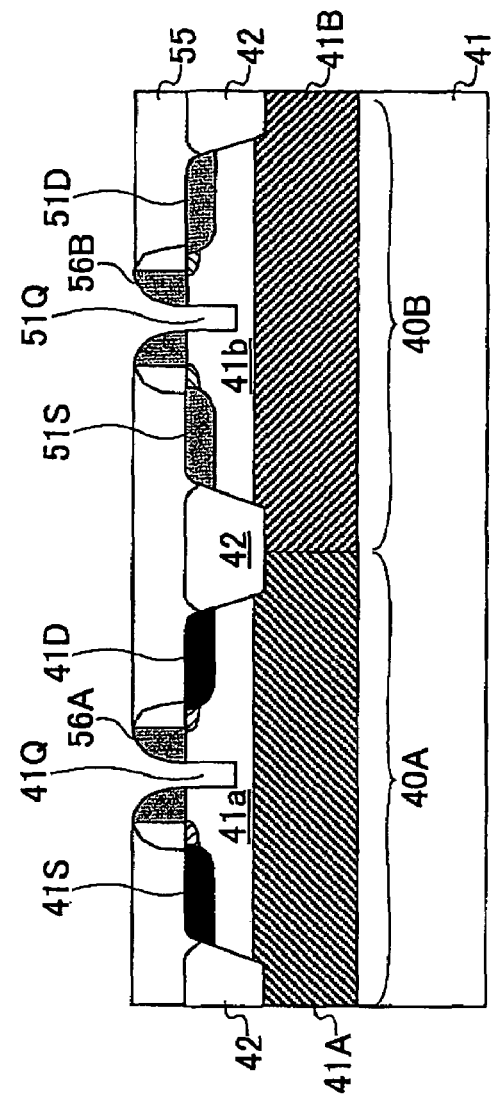
FIG.22A
FIG.22B

SEMICONDUCTOR DEVICE, MANUFACTURING METHOD THEREOF, AND CMOS INTEGRATED CIRCUIT DEVICE

This application is the division of the U.S. application Ser. No. 10/633,538 dated Aug. 5, 2003, now U.S. Pat. No. 7,034,366.

CROSS-REFERENCE TO RELATED APPLICATIONS

The present application is based on Japanese priority application No. 2002-238554 filed on Aug. 19, 2002, the entire contents of which are hereby incorporated by reference.

BACKGROUND OF THE INVENTION

1. Field of the Invention

The present invention generally relates to semiconductor devices, and more particularly, to a very-high-speed semiconductor device having a short gate length and manufacturing method thereof.

2. Description of the Related Art

With the progress of miniaturization technology, the gate length of 0.1 µm or less is becoming possible in today's very-high-speed semiconductor devices, and attempts have been made to realize a very high speed operation using such ultra-miniaturized semiconductor devices.

On the other hand, in such ultra-miniaturized semiconductor devices, as a result of reducing the gate length, a so-called short channel effect tends to occur and punch-through of carriers is apt to occur between the source region and the drain region.

Consequently, as shown in FIG. 1, in the conventional ultra-miniaturized semiconductor devices, pocket implantation is performed so as to control the short channel effect, and channel stop implantation is performed so as to control punch-through.

FIG. 1 shows the construction of a conventional p-channel MOS transistor 10 having a pocket implantation region and a channel stop implantation region.

Referring to FIG. 1, a device region 12A is defined by element isolation regions 12B of the STI structure on a p-type Si substrate 11 on which an n-type well 12 is formed. An n-type channel stop region 12C is formed in the device region 12A by ion implantation of an n-type impurity element.

On the other hand, in the device region 12A, a gate electrode 14 corresponding to a predetermined channel region is formed on the Si substrate 11 via a gate insulating film 13. In the device region 12A, a p+ type source region 12S and a drain 12D are formed on both sides of the gate electrode 14, respectively, each being distant from a sidewall surface of the gate electrode 14 at a distance equal to the thickness of a sidewall insulating film formed on the sidewall surface. In addition, a p-type source extension region 12Se and a drain extension region 12De extend under the sidewall insulating film from the source region 12S and the drain region 12D, respectively. A channel is formed between the end of the source extension region 12Se and the end of the drain extension region 12De.

Further, in the device region 12A, n-type pocket regions 12P are formed so as to contain the source extension region 12Se and the drain extension region 12De and to extend further downward than a part where an inversion layer constituting the channel is formed.

In the p-channel MOS transistor thus constructed, since the n-type channel stop region 12C is formed under the channel region, the entry of carriers into a deep part of the device region 12A is controlled. Thus, punch-through between the source region 12S and the drain region 12D is controlled. Additionally, since the source extension region 12Se and the drain extension region 12De are contained in the n-type pocket regions 12P, extension of a depletion layer from the drain region is controlled when a MOS transistor is in operation. Thus, short channel effect is controlled. As a result, roll-off characteristics of the MOS transistor are improved. Such pocket regions 12P can be formed by oblique ion implantation using the gate electrode 14 as a mask.

Similar constructions can be formed with respect to n-channel MOS transistors.

On the other hand, in the MOS transistor on which such pocket implantation is performed, when the gate length is further reduced, it is necessary to further increase the impurity concentration of the pocket regions 12P.

When the impurity concentration of the pocket region 12P is increased, however, the impurity element forming the pocket regions 12P gains entrance into the region directly below the gate electrode 14. As a result, the impurity concentration increases in the channel surface. Hence, a problem of degradation of mutual conductance arises, accompanying the decrease of mobility due to the scatter of the carriers.

In addition, when such pocket regions 12P are formed, substrate impurity concentration in the vicinity of the source or drain region is increased. Consequently, the width of the depletion layer that is formed around the source region 12S or the drain region 12D is decreased. Hence, problems such as increase in junction capacitance and increase in junction leakage current occur.

On the other hand, conventionally, Japanese Laid-Open Patent Application No. 6-37309 proposes to perform oblique ion implantation from surroundings of a gate electrode so as to form a punch-through stopper region in the central region of a channel.

FIG. 2 shows the construction of a semiconductor device 20 according to the above-described proposal.

Referring to FIG. 2, the semiconductor device 20 is an n-channel MOS transistor. A device region 21A defined by device isolation films 21B is formed on a p-type Si substrate 21. A gate electrode 23 is formed on the device region 21A via a gate insulating film 22.

In addition, in the device region 21A, n-type LDD regions 24Sd and 24Dd, corresponding to both ends of the gate electrode 23, are formed. Further, an n+ type source region 24S and an n+ type drain region 24D, corresponding to the outer ends of sidewall insulating films 23S of the gate electrode 23, are formed.

Additionally, in the conventional semiconductor device 20 in FIG. 2, in the device region 21A, a p-type region 25 is formed as a punch-through stopper region between the LDD regions 24Sd and 24Dd.

FIG. 3 shows the forming process of such a longitudinal punch-through stopper region 25.

Referring to FIG. 3, the Si substrate 21 is rotated about the axis that passes through the gate electrode 23, and by performing ion implantation of B+ at an angle, the punch-through stopper region 25 is formed as an overlapping part of the ion implantation.

As described above, in the construction shown in FIG. 2, the B concentration of the punch-through stopper region 25 is increased only to approximately twice as much as that of the surrounding region at best. Thus, there is no guarantee that the punch-through stopper region 25 will function as an effective punch-through stopper region. Also, in FIGS. 2 and 3, the punch-through stopper region 25 is illustrated to extend in the direction perpendicular to the principal surface of the substrate 21. The shape of the punch-through stopper region 25 is, however, determined by the distribution of B in the ion implantation process of FIG. 3. Accordingly, there is a possibility that the punch-through stopper region 25 will not always be formed into a narrow shape extending in the direction perpendicular to the substrate surface.

FIG. 4 shows the relationship between substrate impurity concentration and OFF current in a case where the punch-through stopper region 25 is eliminated from the MOS transistor in FIG. 2. FIG. 5 is a device simulation result showing the relationship between the substrate impurity concentration and junction capacitance in the same MOS transistor.

As can be seen from FIG. 4, the OFF current is decreased as the substrate impurity concentration is increased. This shows the reduction of the punch-through effect obtained by providing an inversion channel and a reverse conducting type region in the channel region. For example, it is recognized that the OFF current can be reduced to equal to or less than approximately $1 \times 10^{-9}$ A/μm by increasing the substrate impurity concentration to equal to or more than $3 \times 10^{18}$ cm$^{-3}$.

On the other hand, referring to the relationship shown in FIG. 5, the junction capacitance in the source region 24S or the drain region 24D is increased as the substrate impurity concentration is increased. For example, it is recognized that the substrate impurity concentration needs to be set equal to or less than $1 \times 10^{18}$ cm$^{-3}$ if an attempt is made to decrease the junction capacitance to equal to or less than $3 \times 10^{-15}$ F/μm.

As described above, it is impossible to make the control of punch-through and the reduction of the junction capacitance compatible in the structure without a punch-through stopper region. On the other hand, as shown in FIG. 1, with the construction where the high-concentration channel stop region 12C is provided between the source region 12S and the drain region 12D, it is impossible to prevent the junction capacitance from being increased. In addition, in the construction shown in FIG. 2, it is conceived that the effect of the punch-through stopper region is insufficient.

SUMMARY OF THE INVENTION

Accordingly, it is a general object of the present invention to provide an improved and useful semiconductor device and manufacturing method thereof in which the above-mentioned problems are eliminated.

It is another and more specific object of the present invention to provide a semiconductor device having a construction suitable for ultra-miniaturization and capable of effectively controlling punch-through, and to provide a manufacturing method thereof.

The objects described above are achieved by a semiconductor device that includes:

a semiconductor substrate;

a gate electrode formed on the semiconductor substrate via a gate insulating film;

a source region and a drain region of a first conductivity type formed on both sides of the gate electrode, respectively, in the semiconductor substrate; and a punch-through stopper region of a second conductivity type formed in the semiconductor substrate such that the second conductivity type punch-through stopper region is located between the source region and the drain region at distances from the source region and the drain region and extends in a direction perpendicular to a principal surface of the semiconductor substrate, wherein the concentration of an impurity element of the second conductivity type in the punch-through stopper region is set to at least five times the substrate impurity concentration between the source region and the drain region.

According to the present invention, it is possible to effectively control punch-through by setting the concentration of an impurity element of the second conductivity type in the punch-through stopper region thus formed to at least five times the substrate impurity concentration between the source region and the drain region. Also, in the present invention, the punch-through stopper region that is doped to a high impurity concentration is formed at a distance from the source extension region and the drain extension region. For this reason, it is possible to eliminate problems such as decrease in the operation speed due to an increase in junction capacitance and increase in junction leakage current. Specifically, it is possible to effectively control punch-through by forming the punch-through stopper region such that its bottom is located deeper than the junction depth of the source region or the drain region, its top is located within 10 nm from the channel surface, and its width is equal to or more than 10 nm.

In addition, the objects described above are also achieved by a CMOS integrated circuit device that includes:

a semiconductor substrate where a first device region and a second device region are defined, the first device region being formed with a first element of a first conductivity type including an inversion channel of a second conductivity type, and the second device region being formed with a second element of the second conductivity type including an inversion channel of the first conductivity type;

a first well of the first conductivity type having higher impurity concentration and formed in the first device region at a distance from a surface of the semiconductor substrate;

a second well of the second conductivity type having higher impurity concentration and formed in the second device region at a distance from the surface of the semiconductor substrate;

a first gate electrode formed on the semiconductor substrate via a first gate insulating film so as to correspond to the first device region;

a second gate electrode formed on the semiconductor substrate via a second gate insulating film so as to correspond to the second device region;

a first source region and a first drain region of the second conductivity type formed in the first device region in the semiconductor substrate on both sides of the first gate electrode, respectively, at a distance from the first well;

a second source region and a second drain region of the first conductivity type formed in the second device region in the semiconductor substrate on both sides of the second gate electrode, respectively, at a distance from the second well;

a first punch-through stopper region of the first conductivity type formed between the first source region and the first drain region at distances from the first source region and the first drain region in the first device region in the semiconductor substrate and extending in a direction perpendicular to a principal surface of the semiconductor substrate; and a second punch-through stopper region of the second conductivity type formed between the second source region and the second drain region at distances from the second source region and the second drain region in the second device region in the semiconductor substrate and extending in a direction perpendicular to the principal surface of the semiconductor substrate, wherein the bottom of the first punch-through stopper region reaches in the vicinity of the first well, and the bottom of the second punch-through stopper region reaches in the vicinity of the second well.

According to the present invention, it is possible to effectively control CMOS latch-up caused by a parasitic lateral bipolar transistor by forming punch-through stopper regions such that the punch-through stopper regions reach in the vicinities of wells formed under the respective device regions or the wells in a p-channel MOS transistor and an n-channel MOS transistor constructing a CMOS semiconductor device.

Further, the objects described above are also achieved by a manufacturing method of a semiconductor device, including the steps of:

forming a dummy gate electrode on a surface of a semiconductor substrate so as to correspond to a channel region;

forming a source region and a drain region by introducing an impurity element of a first conductivity type into the semiconductor substrate using the dummy gate electrode as a mask;

forming an insulating film on the surface of the semiconductor substrate so as to cover the dummy gate electrode;

polishing the insulating film until the dummy gate is exposed;

removing the dummy gate electrode and forming an opening in the insulating film;

forming a sidewall film on a sidewall surface of the opening; and forming a punch-through stopper region extending in a direction perpendicular to the surface of the semiconductor substrate by performing ion implantation of an impurity element of a second conductivity type into the semiconductor substrate at least twice with different acceleration voltages using the insulating film and the sidewall film as a mask, wherein the step of forming the punch-through stopper region is performed later than the step of forming the source region and the drain region.

According to the present invention, it is possible to form a desired punch-through stopper region into a shape of a high-concentration region extending in the direction perpendicular to the principal surface of a substrate with a limited width, by repeating ion implantation more than once while varying acceleration voltage and using a self-aligning-mask after the formation of the source and drain regions using the dummy gate electrode. Especially, it is possible to form a high-concentration region where lateral struggle of implanted ions is little by using B when a p-type dopant is used and P when an n-type dopant is used.

Other objects, features and advantages of the present invention will become more apparent from the following detailed description when read in conjunction with the following drawings.

BRIEF DESCRIPTION OF THE DRAWINGS

FIG. 9 is still another graph for explaining the principles of the present invention;

FIG. 10 is yet another graph for explaining the principles of the present invention;

FIG. 11 is another graph for explaining the principles of the present invention;

FIG. 12 is a schematic diagram showing the construction of a CMOS integrated circuit device according to a first embodiment of the present invention;

FIGS. 13A, 13B, 13C, 13D, 13E, 13F, 13G, 13H, 13I, 13J, 13K, 13L and 13M are schematic diagrams showing manufacturing steps of the CMOS integrated circuit device shown in FIG. 12;

FIGS. 22A, 22B, 22C, 22D, 22E, 22F, 22G, 22H and 22I are schematic diagrams showing manufacturing steps of a CMOS integrated circuit device according to a third embodiment of the present invention.

DETAILED DESCRIPTION OF THE PREFERRED EMBODIMENTS

Figure 1:
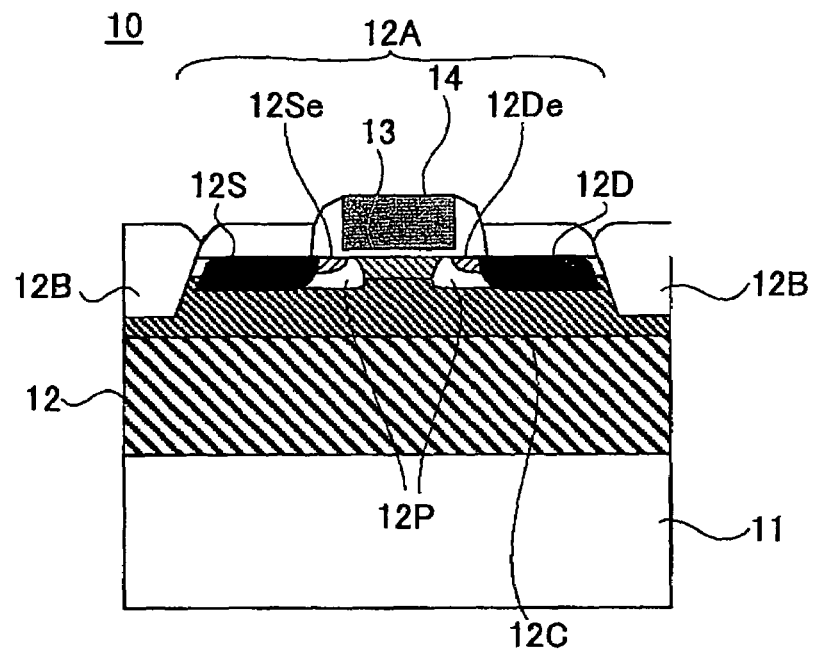
FIG. 1 is a schematic diagram showing the construction of a conventional semiconductor device.
Figure 2:
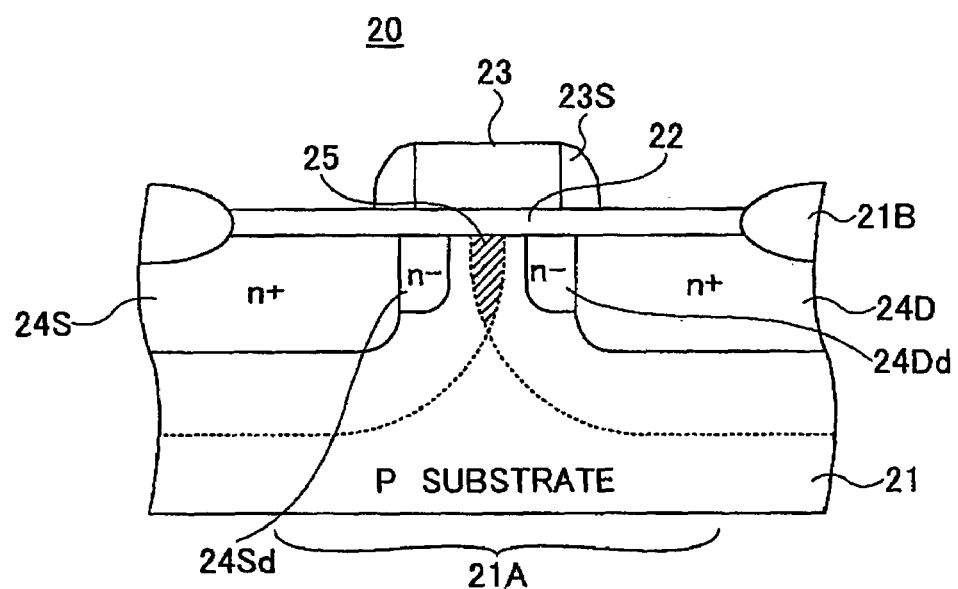
FIG. 2 is a schematic diagram showing the construction of another conventional semiconductor device.
Figure 3:
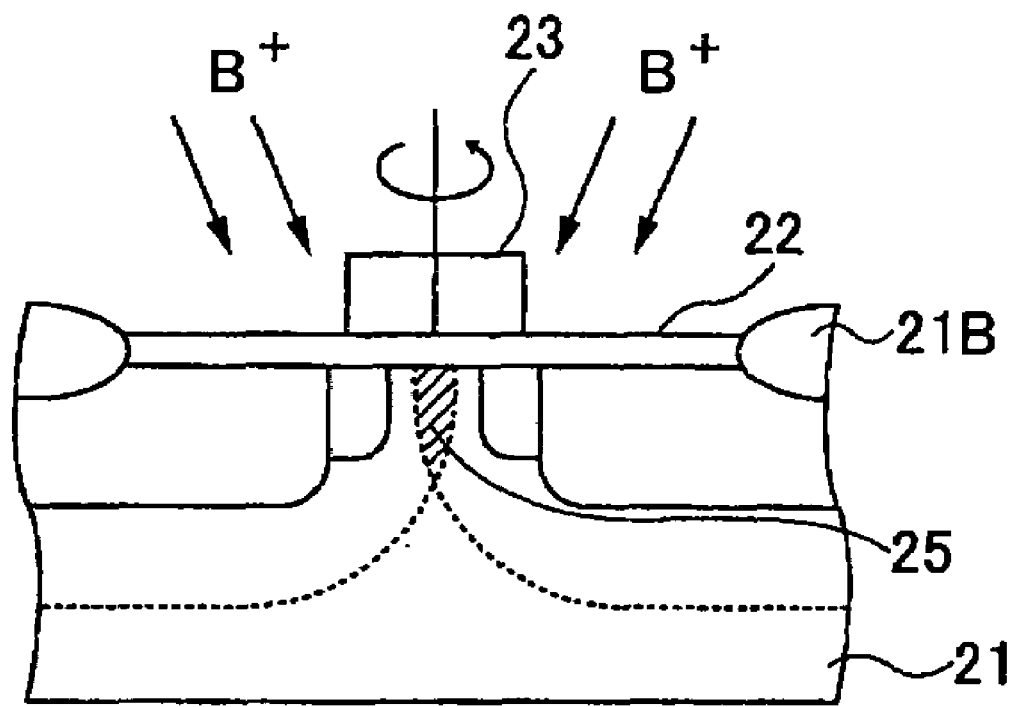
FIG. 3 is a schematic diagram showing a manufacturing step of the conventional semiconductor device shown in FIG. 2.
Figure 4:
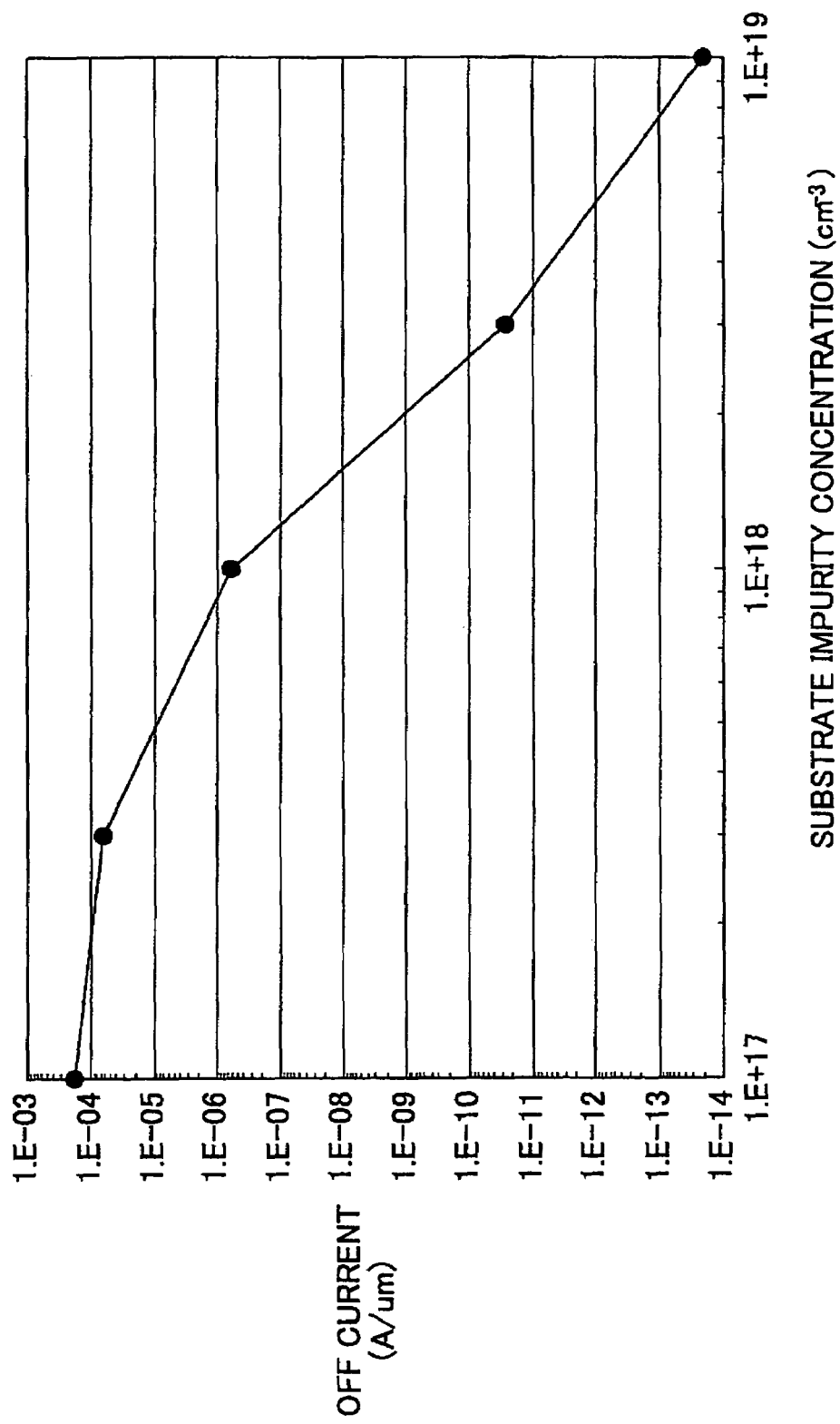
FIG. 4 is a graph showing the relationship between OFF current and substrate impurity concentration in the conventional semiconductor device.
Figure 5:
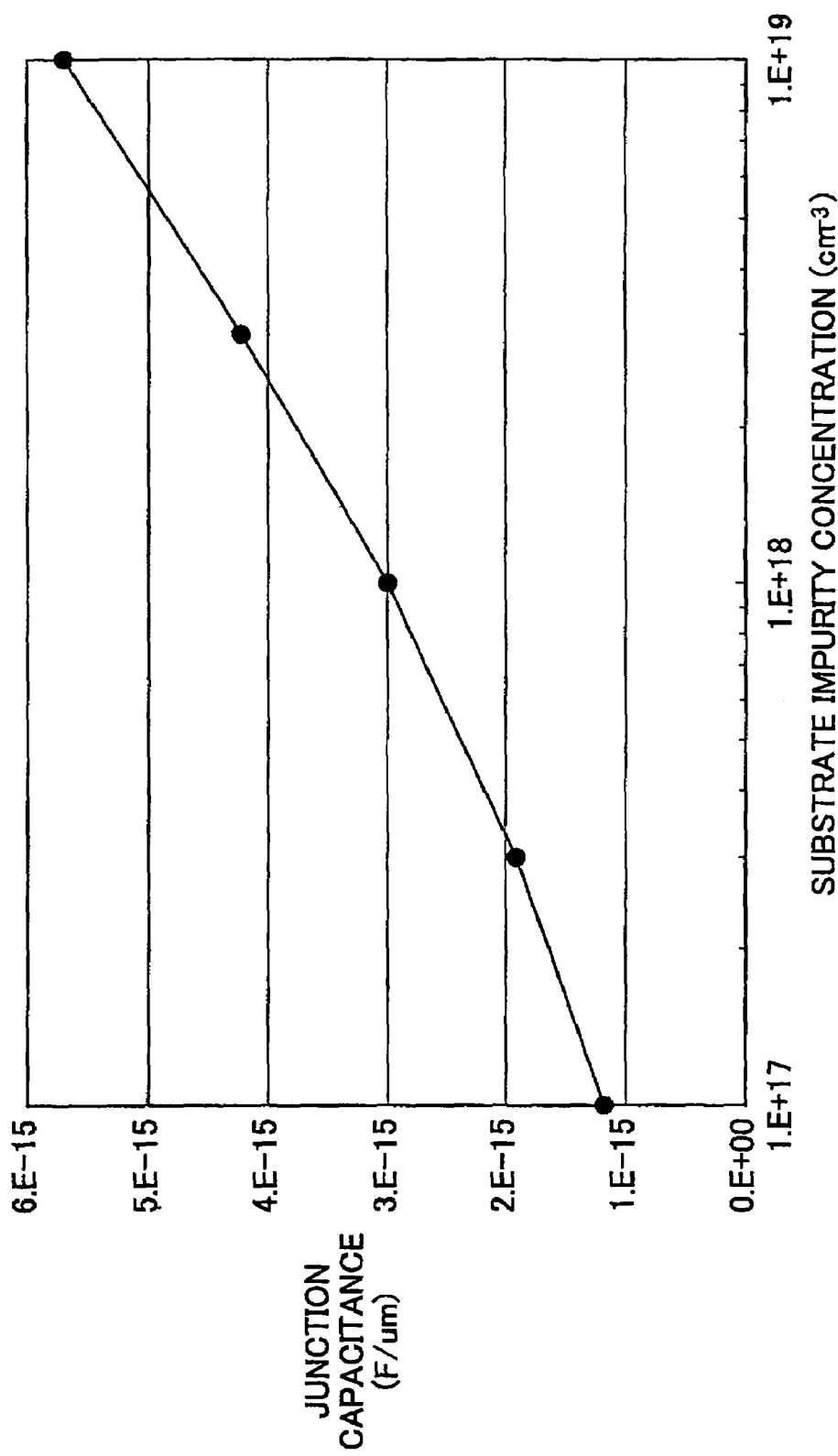
FIG. 5 is a graph showing the relationship between junction capacitance and the substrate impurity concentration in the conventional semiconductor device.
Figure 6:
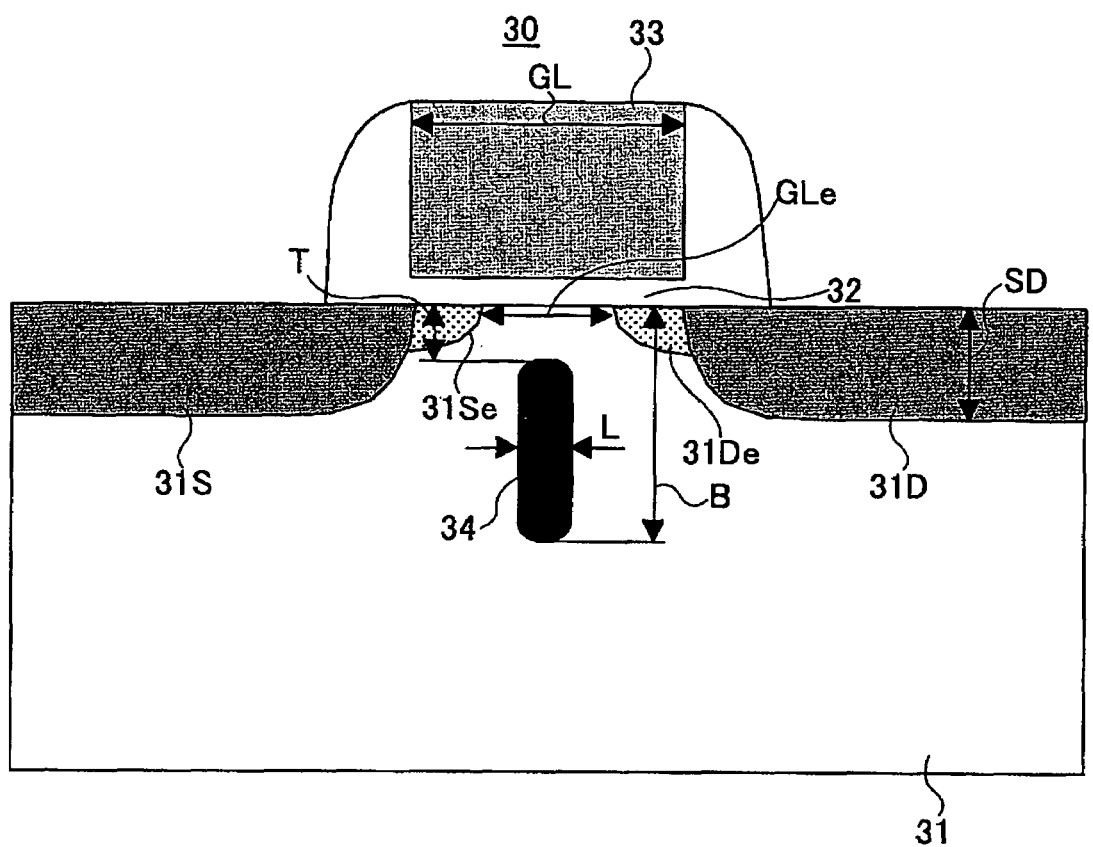
FIG. 6 is a schematic diagram for explaining the principles of the present invention.

FIG. 6 shows the principles of the present invention.

Referring to FIG. 6, when a semiconductor device is an n-channel MOS transistor, for example, a gate electrode 33 is formed on a p-type Si substrate 31 via a gate insulating film 32. In the Si substrate 31, an n-type diffusion region is formed on either side of the gate electrode 33 as a source region 31S and a drain region 31D. Also, an n-type source extension region 31Se is formed at an end of the source region 31S, and an n-type drain extension region 31De is formed at an end of the drain region 31D. In FIG. 6, the illustration of a pocket diffusion region is omitted.

In the MOS transistor in FIG. 6, the gate length of the gate electrode 33 is GL, and the source region 31S and the drain region 31D are formed with the junction depth of SD. Additionally, an effective channel length formed between the source extension region 31Se and the drain extension region 31De is GLe.

In the MOS transistor of FIG. 6, in a part directly below the gate electrode 33, a longitudinal p-type region 34 having the length of L in the direction of the gate length is further formed as a punch-through stopper region. The punch-through stopper region is formed such that its top is distant from the substrate surface by T, and its bottom is distant from the substrate surface by B.

Figure 7:
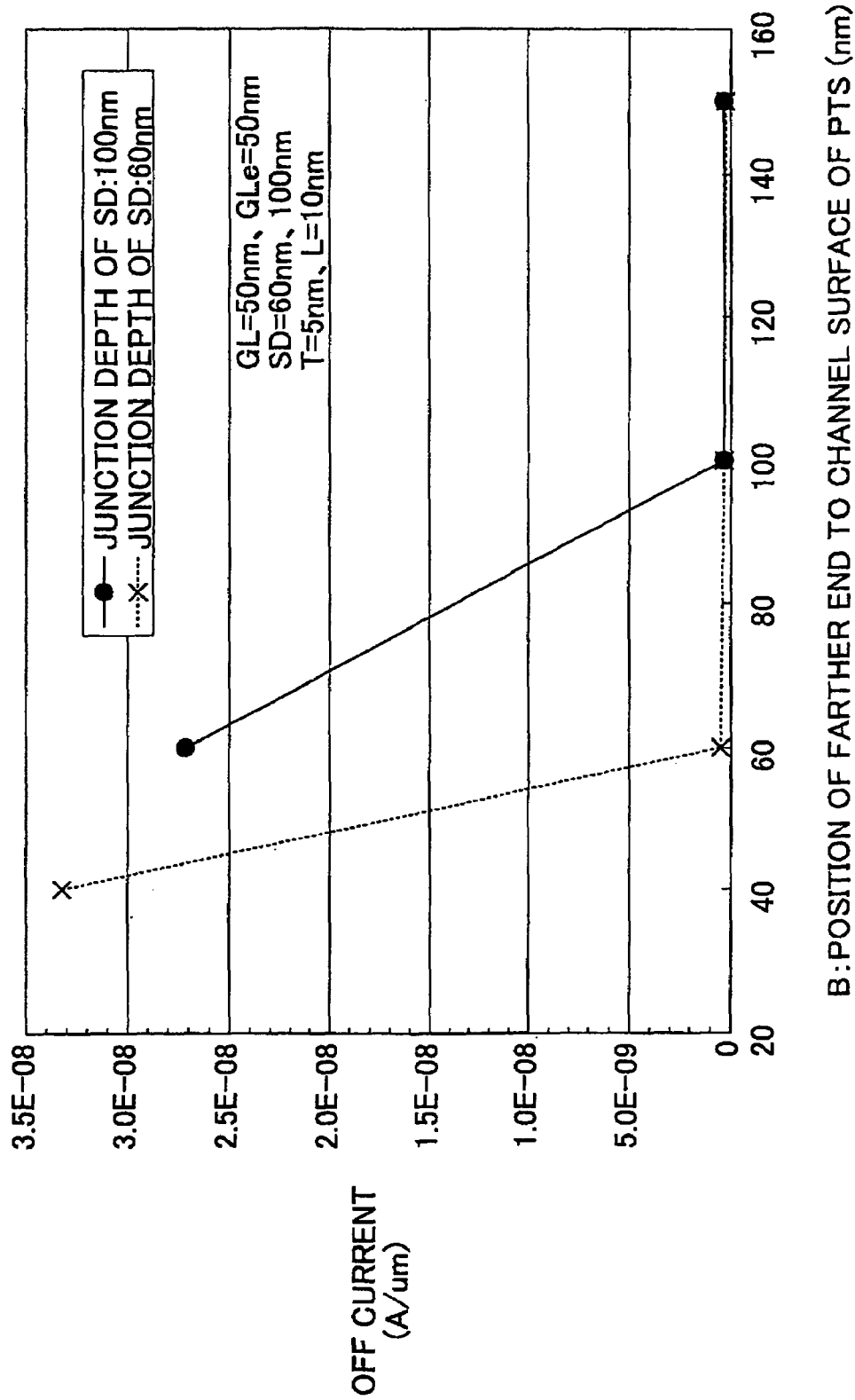
FIG. 7 is a graph for explaining the principles of the present invention.

FIG. 7 shows OFF current in a case where, in the MOS transistor in FIG. 6, the distance B of the punch-through stopper region 34 is varied in many ways, where the gate length GL and the effective gate length GLe are 50 nm, the source/drain junction depth SD is 60 nm or 100 nm, the distance (depth) T of the punch-through stopper region 34 is 5 nm, and the length L of the punch-through stopper region 34 is 10 nm. It should be noted that the impurity concentration of the substrate 31 is $1 \times 10^{16}$ cm$^{-3}$, and the impurity concentration of the punch-through stopper region 34 is $1 \times 10^{19}$ cm$^{-3}$.

Referring to FIG. 7, in the case where the source/drain junction depth SD is 60 nm, when the distance B of the punch-through stopper region 34 is shallower than the junction depth SD, 40 nm, the OFF current of approximately $3.3 \times 10^{-8}$ A/μm is observed. On the other hand, in the case where the distance B is 60 nm, which is the same as the junction depth SD, it is observed that the OFF current is decreased to less than $1.0 \times 10^{-9}$ A/μm.

Similarly, in the case where the source/drain junction depth SD is 100 nm, when the distance B of the punch-through stopper region 34 is shallower than the junction depth SD, 60 nm, the OFF current of approximately $2.8 \times 10^{-8}$ A/μm is observed. On the other hand, in the case where the distance B is 100 nm, which is the same as the junction depth SD, it is observed that the OFF current is decreased to less than $1.0 \times 10^{-9}$ A/μm.

The results in FIG. 7 show that the punch-through between the source region 31S and the drain region 31D can be effectively controlled, when the punch-through stopper region 34 thus formed is with the distance B that is deeper than the junction depth SD of the source/drain region 31S or 31D.

Figure 8:
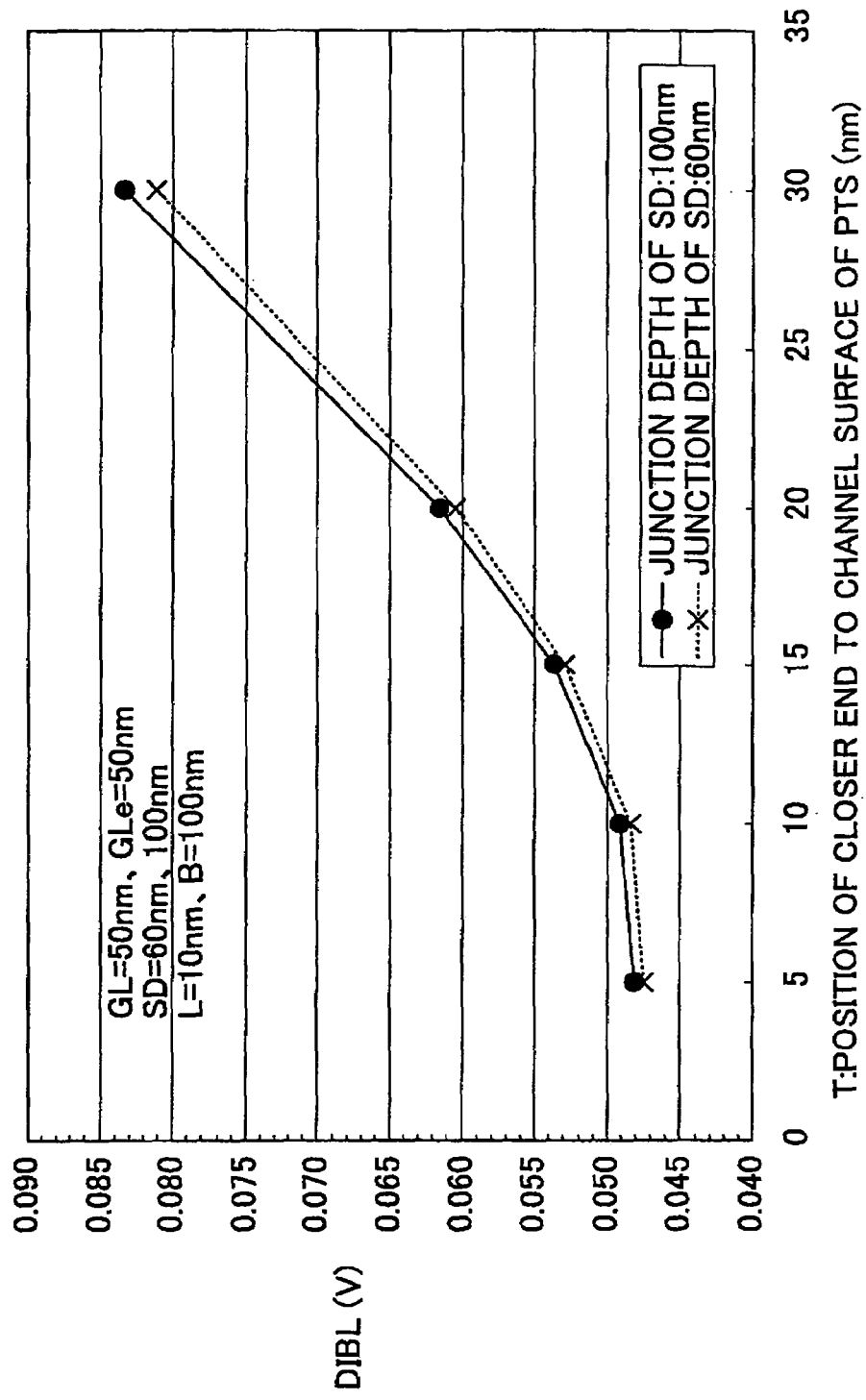
FIG. 8 is another graph for explaining the principles of the present invention.

FIG. 8 shows DIBL (drain-induced barrier lowering) in a case where the distance T of the top of the punch-through stopper region 34 is varied in many ways in the MOS transistor shown in FIG. 6, where the gate length GL and the effective gate length GLe are 50 nm, the substrate impurity concentration is $1 \times 10^{16}$ cm$^{-3}$, the impurity concentration in the punch-through stopper region 34 is $1 \times 10^{19}$ cm$^{-3}$, the length L of the punch-through stopper region 34 is 10 nm, and the distance B of the bottom is 100 nm. It should be noted that the DIBL represents the difference between the threshold voltage value in the case where the drain voltage is 50 mV and the threshold voltage value in the case where the drain voltage is 1 V.

Referring to FIG. 8, when the distance (depth) T of the top of the punch-through stopper region 34 is long (deep), the value of the DIBL becomes great and the short channel effect becomes significant. On the other hand, when the distance T is equal to or less than 10 nm, the threshold value characteristics hardly change. When the punch-through stopper region 34 reaches to the surface of the substrate 31, however, the channel is cut off. Thus, it is conceived that a problem of degradation of mutual conductance arises.

Next, FIG. 9 shows values of the OFF current in a case where the length L of the punch-through stopper region 34 is varied in many ways in the MOS transistor shown in FIG. 6, where the gate length GL and the effective gate length GLe are 50 nm, the substrate impurity concentration is $1 \times 10^{16}$ cm$^{-3}$, the impurity concentration in the punch-through stopper region 34 is $1 \times 10^{19}$ cm$^{-3}$, the distance T of the top of the punch-through stopper region 34 is 5 nm, and the distance B of the bottom is 100 nm.

Referring to FIG. 9, the value of the OFF current rises sharply when the length L of the punch-through stopper region 34 in the longitudinal direction of the gate is less than 7 nm. Thus, it is recognized that the effects of the punch-through stopper region 34 are lost.

FIG. 10 shows values of the junction capacitance in a case where the impurity concentration ratio r of the punch-through stopper region 34 with respect to the substrate impurity concentration is varied in many ways in the MOS transistor shown in FIG. 6, where the gate length GL and the effective gate length GLe are 50 nm, the depth T of the top of the punch-through stopper region 34 is 5 nm, the depth B of the bottom is 100 nm, and the length L of the punch-through stopper region 34 is 10 nm. Additionally, FIG. 11 shows values of the impurity concentration in the punch-through stopper region 34 and the substrate impurity concentration, which values correspond to points ① through ⑤ in FIG. 10.

Referring to FIG. 10, when the impurity concentration ratio r is equal to or less than 5, the value of the junction capacitance is equal to or more than $4 \times 10^{-15}$ F/μm. On the other hand, when the impurity concentration ratio r exceeds 5 (the point ④), the junction capacitance is sharply reduced.

The results in FIGS. 7 through 11 show that it is necessary that the depth B of the bottom of the punch-through stopper region 34 be equal to or more than the junction depth SD of the source/drain region, the depth T of the top be equal to or less than 10 nm, the length L in the longitudinal direction of the channel be equal to or more than 7 nm, and the concentration ratio r be equal to or more than five times the substrate impurity concentration.

First Embodiment

FIG. 12 shows the construction of a CMOS integrated circuit device 40 according to a first embodiment of the present invention.

Referring to FIG. 12, a device region 40A of p-channel elements such as a pMOS transistor having a p-type channel and a device region 40B of n-channel elements such as an nMOS transistor having an n-type channel are defined by device isolation structure 42 of the STI structure on a p-type Si substrate 41. An n-type well 41A is formed in the device region 40A, and a p-type well 41B is formed in the device region 40B.

In the device region 40A, the top of the n-type well 41A is formed at the depth corresponding to the bottom of the STI structure 42. An n-type channel region 41a with n-type impurity concentration of equal to or less than $1.5 \times 10^{18}$ cm$^{-3}$ corresponding to the point ④ in FIG. 11, for example, is formed on the upper side of the n-type well 41A. On the other hand, in the vicinities of source and drain regions 41S and 41D, the concentration of the n-type well is set equal to or less than $1 \times 10^{17}$ cm$^{-3}$.

Similarly, also in the device region 40B, the top of the p-type well 41B is formed at the depth corresponding to the bottom of the STI structure 42. Further, a p-type channel region 41b with p-type impurity concentration of equal to or less than $1.5 \times 10^{18}$ cm$^{-3}$ corresponding to the point ④ in FIG. 11, for example, is formed on the upper side of the p-type well 41B. On the other hand, in the vicinities of source and drain regions 51S and 51D, the concentration of the p-type well 41B is set equal to or less than $1 \times 10^{17}$ cm$^{-3}$.

A gate electrode 44A having the gate length of approximately 50 nm, for example, and corresponding to the p-type channel region formed in the n-type channel region 41a is formed on the n-type channel region 41a via a gate insulating film 43A. In addition, a gate electrode 44B similarly having the gate length of approximately 50 nm and corresponding to the n-type channel formed in the p-type channel region 41b is formed on the p-type channel region 41b via a gate insulating film 43B.

Further, in the n-type channel region 41a, a source extension region 41Se and a drain extension region 41De are formed by the ion implantation of B using the gate electrode 44A as a mask. Also, a source region 41S and a drain region 41D are formed outside the source extension region 41Se and the drain extension region 41De, respectively, by the ion implantation of B using the gate electrode 44A and the sidewall insulating film as a mask.

Similarly, in the p-type channel region 41b, a source extension region 51Se and a drain extension region 51De are formed by the ion implantation of As using the gate electrode 44B as a mask. Also, the source region 51S and drain region 51D are formed outside the source extension region 51Se and the drain extension region 51De, respectively, by the ion implantation of P using the gate electrode 44B and the sidewall insulating film as a mask.

Further, regarding the CMOS integrated circuit, in the n-type channel region 41a, an n-type punch-through stopper region 41P is formed between the source extension region 41Se and the drain extension region 41De so as to extend in the direction substantially perpendicular to the principal surface of the substrate 41. Additionally, in the p-type channel region 41b, a p-type punch-through stopper region 51P is formed between the source extension region 51Se and the drain extension region 51De so as to extend in the direction substantially perpendicular to the principal surface of the substrate 41.

On this occasion, in view of the results previously shown in FIG. 7, it is preferable that the punch-through stopper region 41P be formed to have its bottom at a depth deeper than the junction depth of the source region 41S or the drain region 41D. Also, it is preferable that the punch-through stopper region 51P be formed to have its bottom at a depth deeper than the junction depth of the source region 51S or the drain region 51D. Additionally, in view of the results previously shown in FIG. 8, it is preferable that the punch-through stopper regions 41P and 51P be formed to have their tops at a depth of equal to or less than 10 nm, or preferably equal to or less than 5 nm, from the substrate surface defining the top of the channel. Further, in view of the results previously shown in FIG. 9, it is preferable that the punch-through stopper regions 41P and 51P be formed to have lengths equal to or more than 7 nm, or preferably equal to or more than 10 nm in the longitudinal direction of the gates.

Moreover, in view of the result previously shown in FIG. 10, it is preferable that the punch-through stopper region 41P be formed to have the concentration ratio of the n-type impurity equal to or more than five times, or preferably equal to or more than 10 times, the impurity concentration in the n-type channel region 41a. Also, it is preferable that the p-type punch-through stopper region 51P be formed to have the concentration ratio of the p-type impurity equal to or more than five times, or preferably equal to or more than ten times, the impurity concentration in the p-type channel region 41b. In addition, on this occasion, in view of the results previously shown in FIG. 11, it is preferable that the impurity concentrations of the n-type region 41a and the p-type region 41b be controlled to be equal to or less than approximately $1.5 \times 10^{18}$ cm$^{-3}$.

According to such construction, in the CMOS integrated circuit device 40 shown in FIG. 12, the punch-through is effectively controlled in both the p-channel MOS transistor and the n-channel MOS transistor. At the same time, it is possible to minimize the junction capacitance of the source/drain regions.

Next, referring to FIGS. 13A through 19M, a description will be given of the manufacturing process of the CMOS integrated circuit device 40 shown in FIG. 12.

Referring to FIG. 13A, a resist pattern R1 is formed on the Si substrate 41 formed with a silicon oxide film 42A thereon, so as to cover the p-channel device region 40A. A p– type channel region 41b and a p-type well 41 B thereunder are formed with the impurity concentration of $1 \times 10^{16}$ cm$^{-3}$ and $5 \times 10^{17}$ cm$^{-3}$, respectively, for example, in the n-channel device region 40B by performing ion implantation of B+ into the Si substrate 41 via the silicon oxide film 42A using the resist pattern as a mask.

Next, in the step of FIG. 13B, a resist pattern R2 is formed on the Si substrate 41 so as to cover the n-channel device region 40B. An n– type channel region 41a and an n-type well 41A thereunder are formed with the impurity concentrations of $1 \times 10^{16}$ cm$^{-3}$ and $5 \times 10^{17}$ cm$^{-3}$, respectively, for example, in the p-channel device region 40A by performing the ion implantation of B+ into the Si substrate 41 via the silicon oxide film 42A using the resist pattern R2 as a mask.

Figure 13C:
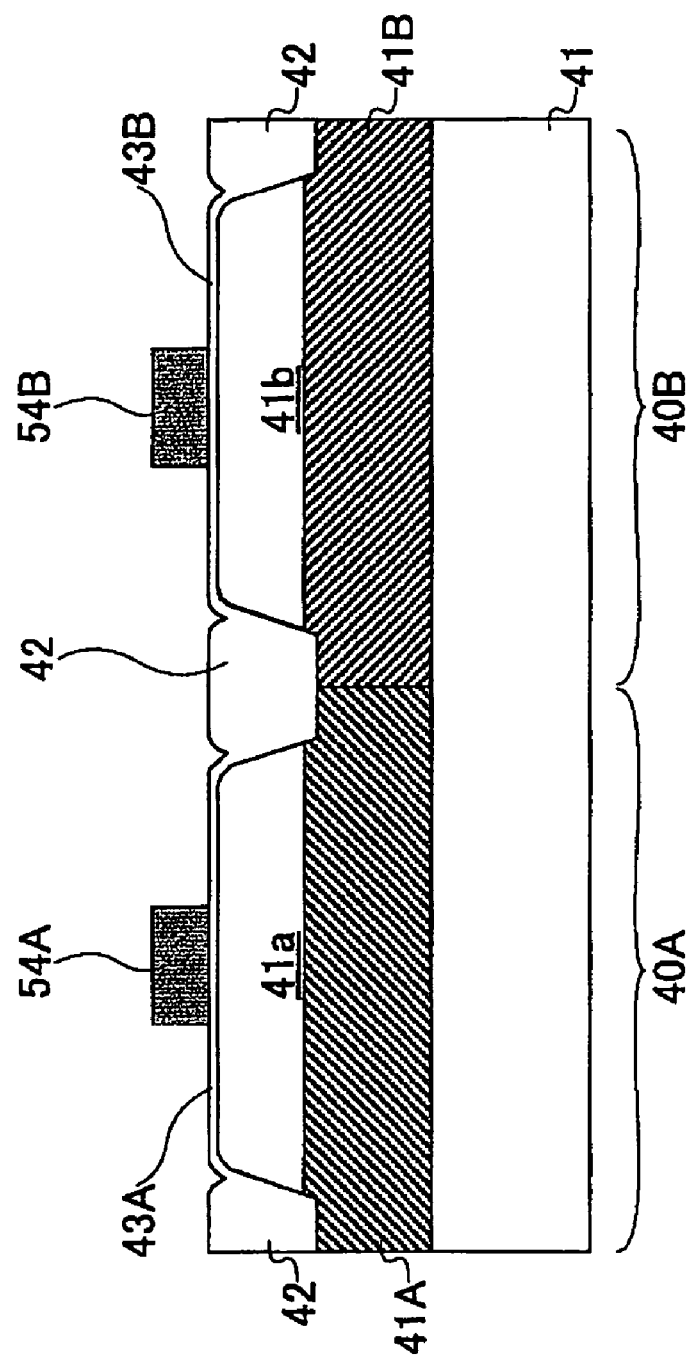

Next, in the step of FIG. 13C, the resist pattern R2 is removed, and further, the silicon oxide film 42A on the surface of the Si substrate 41 is removed.

In the step of FIG. 13C, high-dielectric-constant insulating film such as a silicon nitride film and a silicon oxynitride film is formed as the gate insulating film 43A in the p-channel device region 40A and the gate insulating film 43B in the n-channel device region 40B on the surface of the Si substrate that is further exposed. A dummy gate electrode pattern 54A formed by such as polysilicon and a similar dummy gate electrode pattern 54B are formed on the gate insulating films 43A and 43B, respectively, in accordance with actual gate electrode patterns to be formed.

Next, in the step of FIG. 13D, an n-type diffusion region constructing the source extension region 51Se and the drain extension region 51De is formed with the junction depth of approximately 30 nm, for example, in the p-type channel region 41b by performing ion implantation of As+ in the device region 40B by using the dummy gate electrode 54B as a self-aligning mask while covering the device region 40A with a resist pattern R3 on the construction shown in FIG. 13C.

Similarly, in the step of FIG. 13E, a p-type diffusion region constructing the source extension region 41Se and the drain extension region 41De is formed with the junction depth of approximately 30 nm, for example, in the n-type channel region 41a by performing ion implantation of B+ in the device region 40A by using the dummy gate electrode 54A as a self-aligning mask while covering the device region 40B with a resist pattern R4 on the construction shown in FIG. 13C.

Figure 13F:
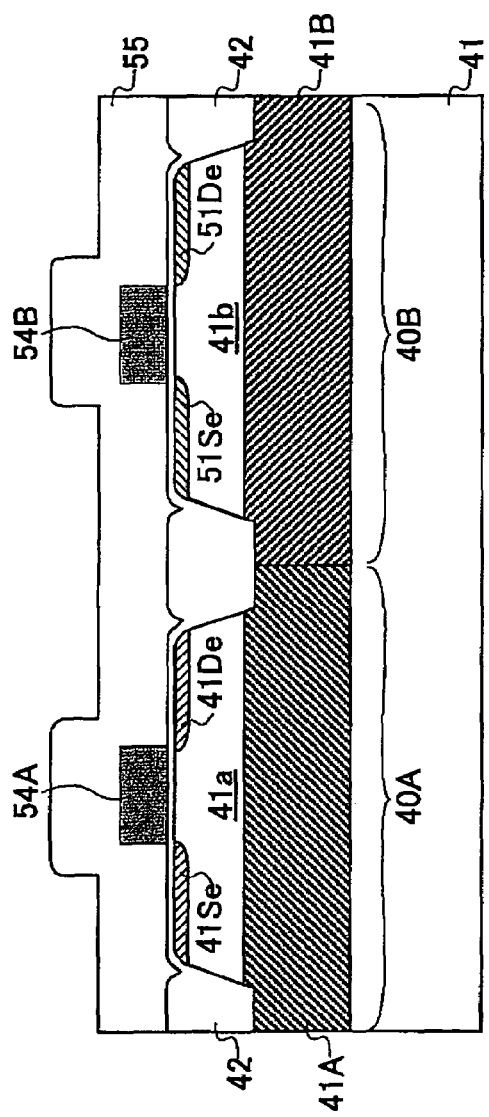

Next, in the step of FIG. 13F, after removing the resist pattern R4, an insulating film 55 of such as $SiO_2$ is formed on the construction shown in FIG. 13E with an even thickness by a CVD method.

Figure 13G:
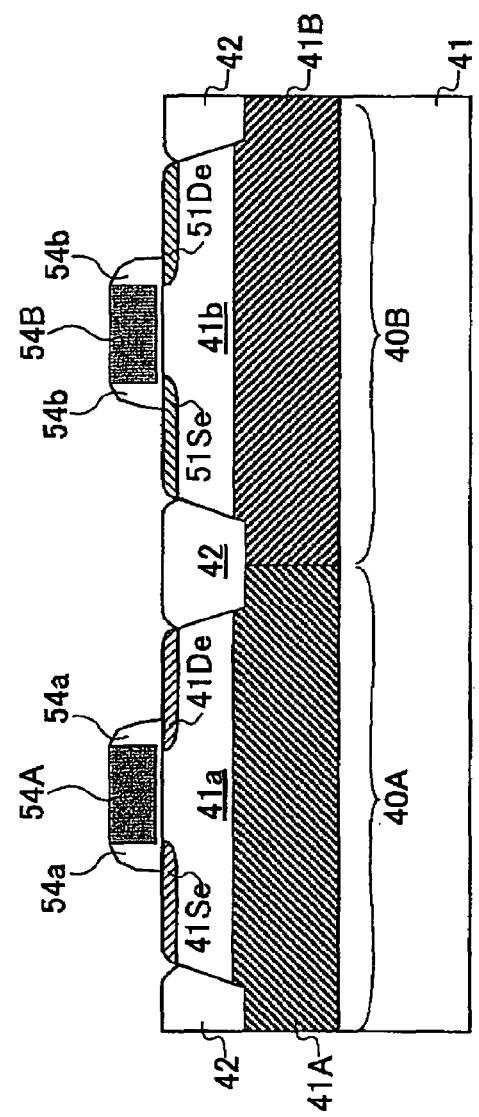

Further, in the step of FIG. 13G, by etch-back of the insulating film 55, a sidewall insulating film 54a and a sidewall insulating film 54b are formed on sidewall surfaces of the dummy gate electrodes 54A and 54B, respectively.

Figure 13H:
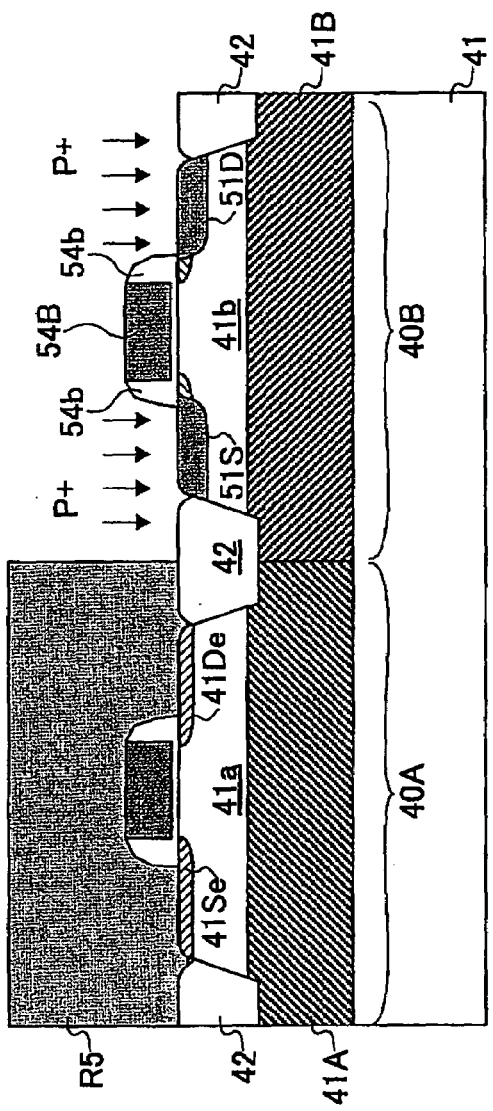

In addition, in the step of FIG. 13H, the n+ type source region 51S and drain region 51D are formed with the junction depth of approximately 60 nm or 100 nm outside the sidewall insulating film 54b in the p-type channel region 41b by forming a resist pattern R5 so as to cover the device region 40A and performing ion implantation of P+ into the device region 40B using the dummy gate electrode 54B and the sidewall insulating film 54b as a mask on the construction shown in FIG. 13G.

Figure 13I:
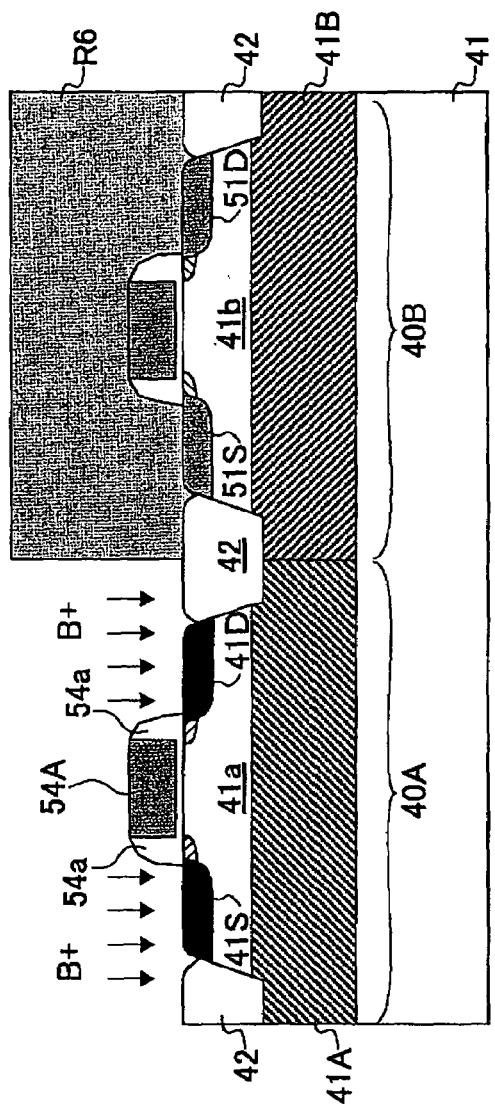

Similarly, in the step of FIG. 13I, after removing the resist pattern R5 from the construction shown in FIG. 13H, the p+ type source region 41S and drain region 41D are formed with the junction depth of approximately 60 nm or 100 nm outside the sidewall insulating film 54a in the n-type channel region 41a by forming a resist pattern R6 so as to cover the device region 40B and performing ion implantation of B+ into the device region 40A using the dummy electrode 54A and the sidewall insulating film 54a as a mask.

Figure 13J:
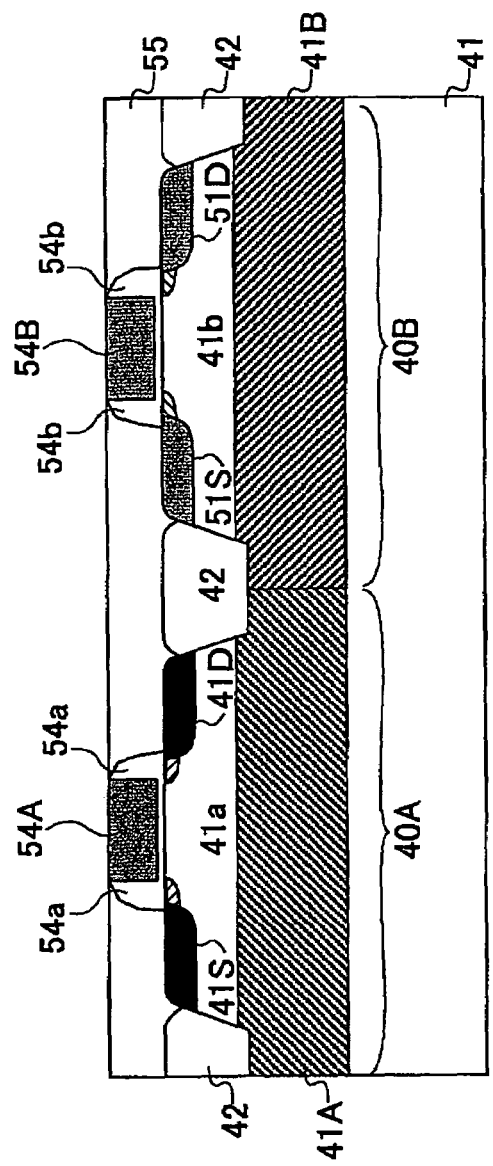

Next, in the step of FIG. 13J, the resist pattern R6 is removed, and further, an $SiO_2$ film is deposited on the Si substrate 41 by the CVD method so as to cover the dummy gate electrodes 54A and 54B. Then, the insulating film 55 exposing the dummy electrodes 54A and 54B from the surface is formed on the Si substrate 41 by polishing the $SiO_2$ film deposited as described above by a CMP method using the dummy electrodes 54A and 54B as stoppers.

Figure 13K:
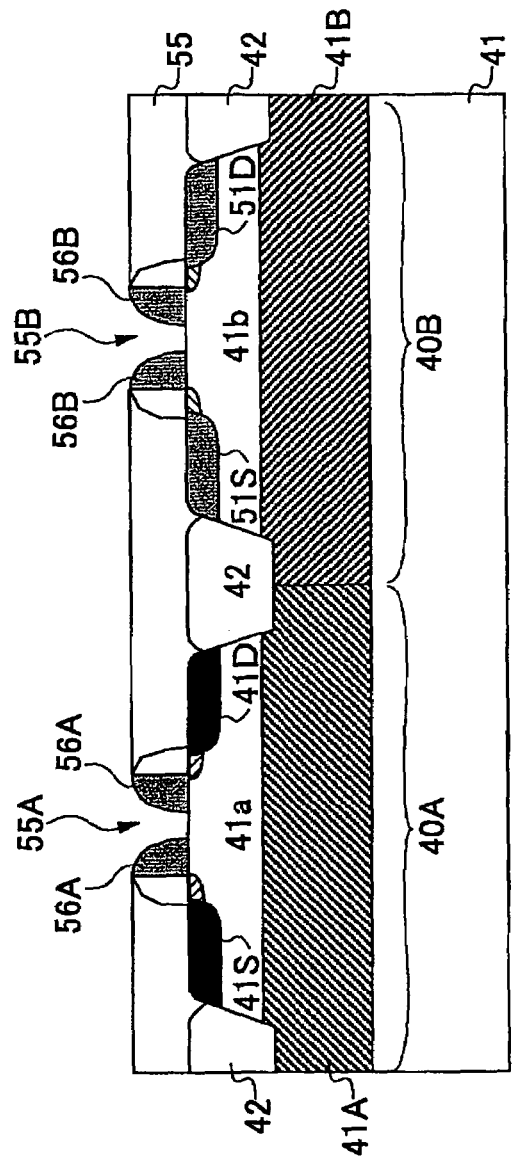

Further, in the step of FIG. 13K, sidewall insulating films 56A and 56B are formed along the sidewall surfaces of concave portions 55A and 55B, respectively, by removing the dummy gate electrodes 54A and 54B, depositing an SiN film on the $SiO_2$ film 55 so as to fill in the concave portions 55A and 55B formed in the insulating film 55 as a result of the removal, and performing etch-back thereto.

Figure 13L:
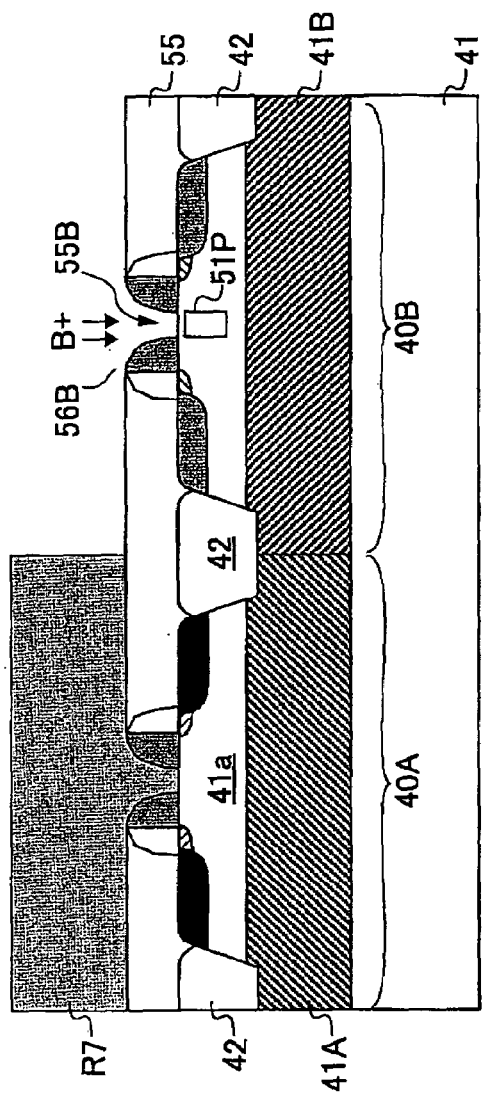

Additionally, in the step of FIG. 13L, the device region 40A is protected by a resist pattern R7, and B+ is introduced into the device region 40B by performing ion implantation more than once while varying acceleration voltage.

Figure 13M:
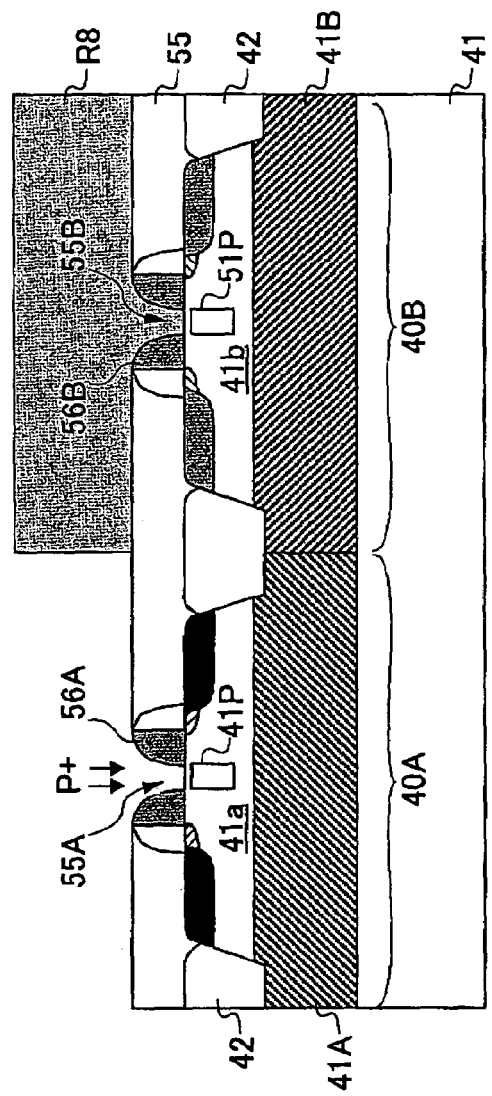

In addition, in the step of FIG. 13M, the device region 40B is protected by a resist pattern R8, and P+ is introduced into the device region 40A by performing ion implantation more than once while varying acceleration voltage.

Furthermore, the punch-through stopper region 41P and the punch-through stopper region 51P are formed in the n-type channel region 41a of the device region 40A and the p-type channel region 41b of the device region 40B, respectively, by performing heat treatment on the construction shown in FIG. 13M after removing the resist pattern R8.

After the step of FIG. 13M, the sidewall insulating films 56A and 56B are removed from the concave portions 55A and 55B, respectively, and the concave portions 55A and 55B are further filled in with polysilicon. Thus, the CMOS integrated circuit device 40 shown in FIG. 12 in advance is obtained.

Figure 14:
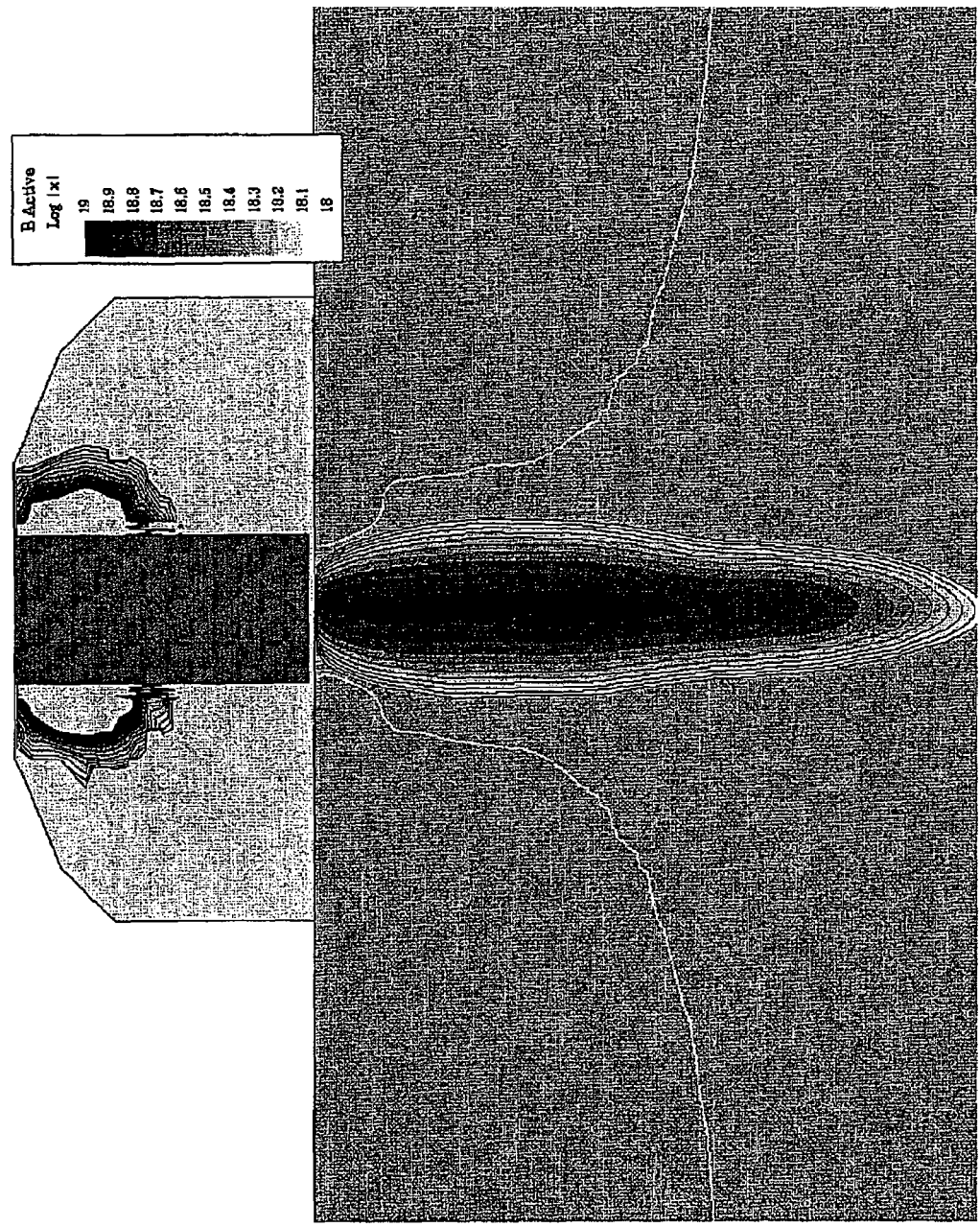
FIG. 14 is a schematic diagram showing the formation of a punch-through stopper region by ion implantation.

FIG. 14 shows the formation of the punch-through stopper region 51P in the p-type channel region 41b by the ion implantation shown in FIG. 13L. It should be noted that FIG. 14 shows the distribution of B atoms in the p-type channel region 41b when ion implantation of B+ is performed with the dosage of $2 \times 10^{14}$ $cm^{-2}$ under the acceleration voltage of 4 keV at first, and subsequently with the dosage of $4 \times 10^{14}$ $cm^{-2}$ under the acceleration voltage of 8 keV, and heat treatment is further performed at 1025° C. for 0.1 second.

As can be seen from FIG. 14, the p-type punch-through stopper region 51P thus formed has the length substantially equal to the width of the mask opening defined by the sidewall insulating films 56B and a shape extending in the direction perpendicular to the principal surface of the Si substrate 41 with controlled impurity concentration profile.

Figure 15:
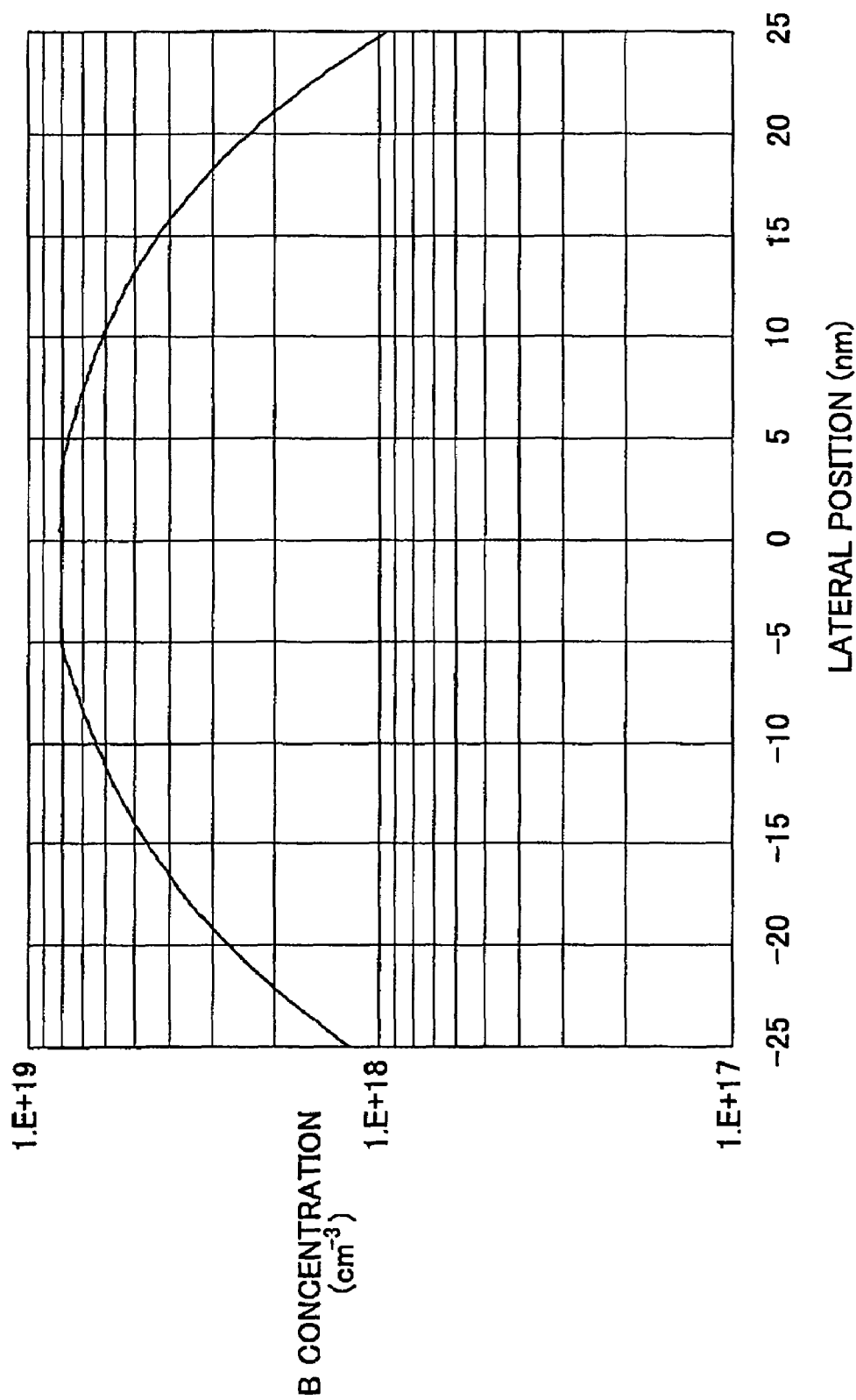
FIG. 15 is a graph showing the formation of the punch-through stopper region by ion implantation.

FIG. 15 shows the distribution of the B+ atoms in a surface parallel to the substrate surface in the punch-through stopper region 51P shown in FIG. 14.

Referring to FIG. 15, in the center part of the punch-through stopper region 51P, B concentration of nearly $1 \times 10^{19}$ $cm^{-3}$ is realized. On the other hand, at the positions distant from the center for 20 nm, the B concentrations are decreased to approximately $1 \times 10^{18}$ $cm^{-3}$. Thus, it is recognized that the concentration ratio of the center part is at least seven to eight times the concentration ratio of the peripheral parts.

Figure 16:
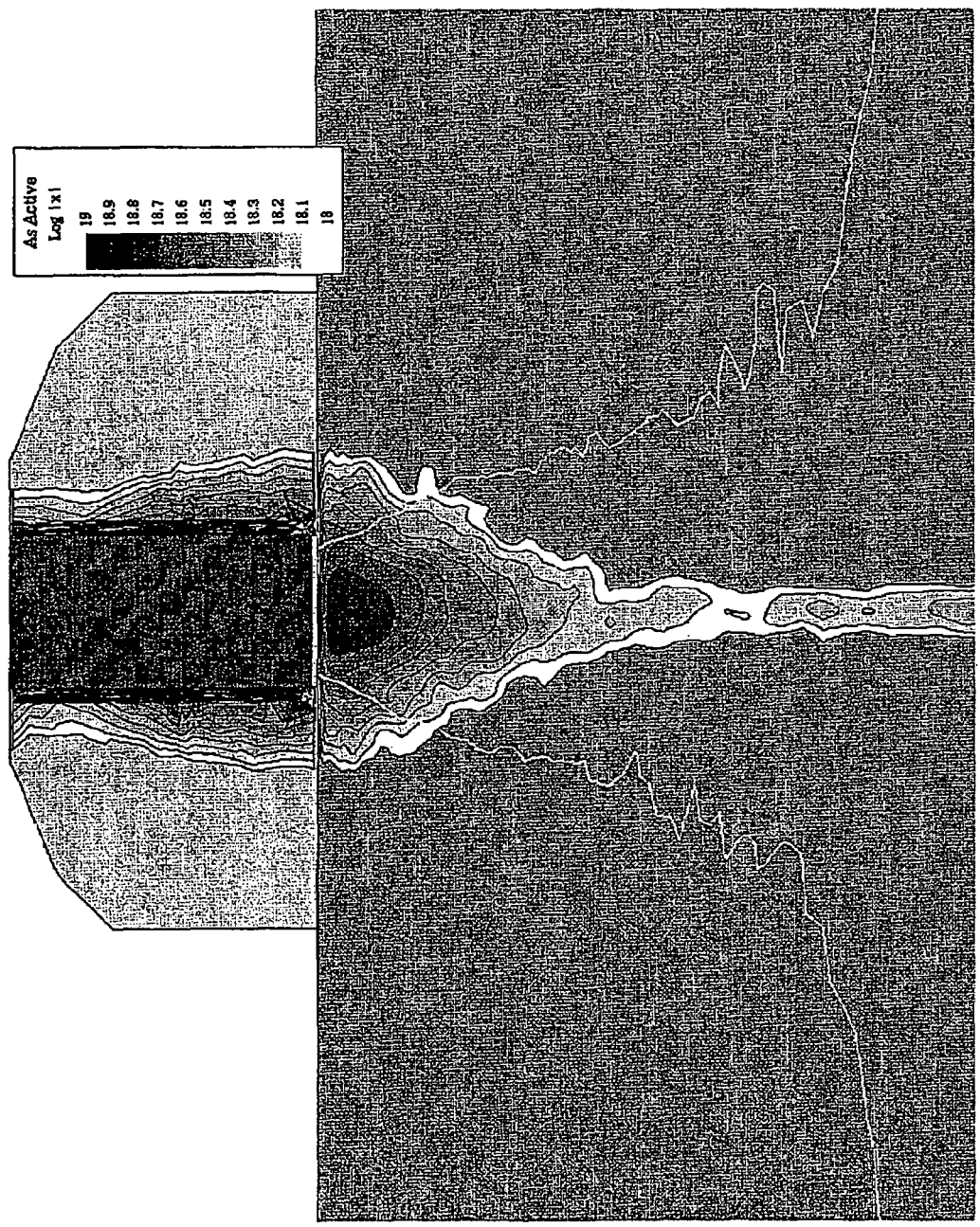
FIG. 16 is a schematic diagram showing the formation of another punch-through stopper region by ion implantation.

FIG. 16 shows the formation of the punch-through stopper region 51P in the p-type channel region 41b in the ion implantation step shown in FIG. 13M by using As. It should be noted that FIG. 16 shows the distribution of As atoms in the n-type channel region 41a when the ion implantation of As+ is performed with the dosage of $5 \times 10^{13}$ $cm^{-2}$ under the acceleration voltage of 100 keV at first, subsequently with the dosage of $1 \times 10^{14}$ $cm^{-2}$ under the acceleration voltage of 200 keV, and heat treatment is further performed at 1025° C. for 0.1 second.

As can be seen from FIG. 16, the depth of the n-type punch-through stopper region 41P thus formed in the substrate is short. On the other hand, in the n-type punch-through stopper region 41P, lateral struggle of As atoms is noticeable. Accordingly, it is recognized that a shape extending in the direction perpendicular to a desired substrate surface with controlled impurity concentration profile is not realized.

Figure 17:
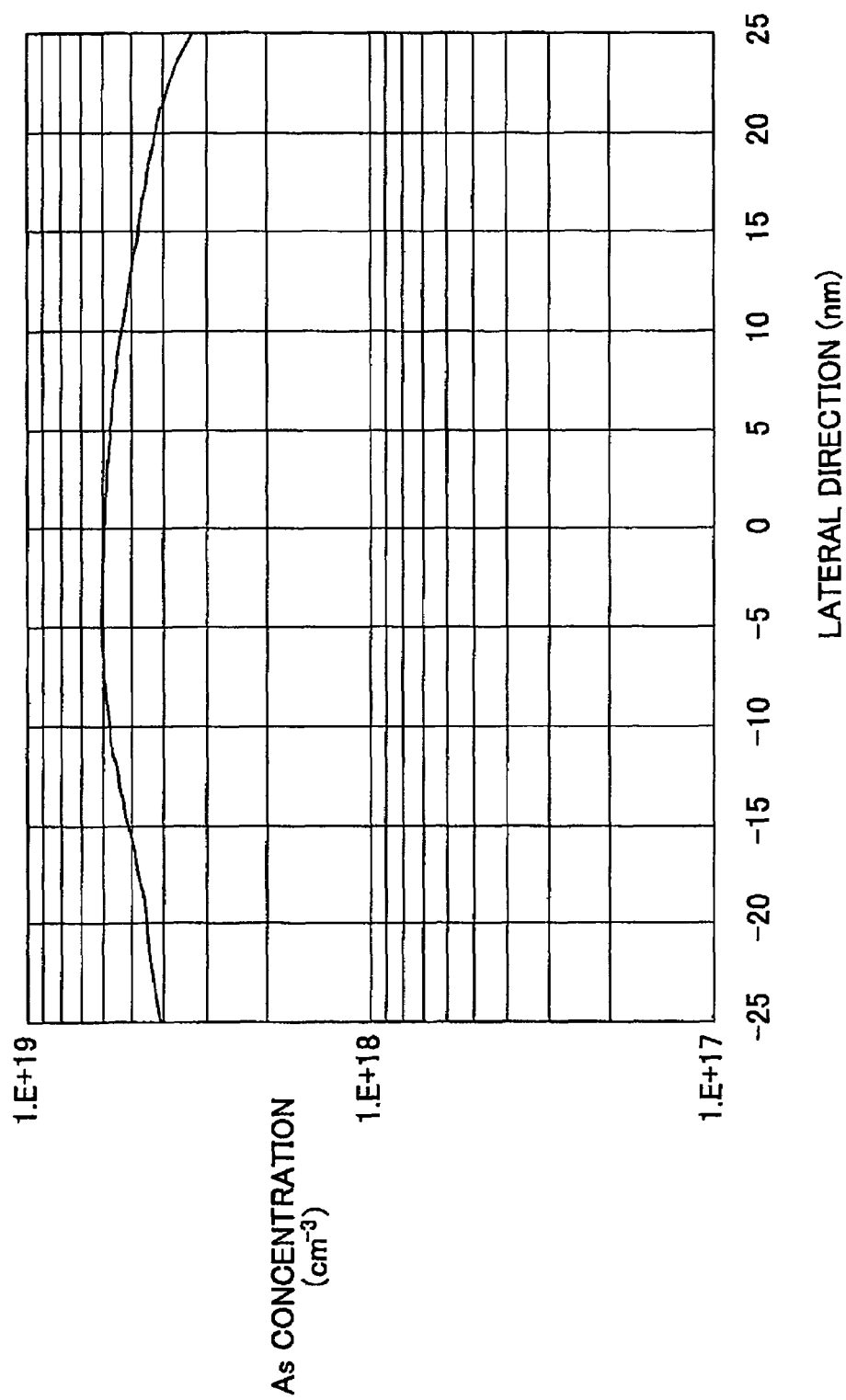
FIG. 17 is a graph showing the formation of the punch-through stopper region by ion implantation.

FIG. 17 shows the distribution of As atoms in a surface parallel to the substrate surface in the punch-through stopper region 41P shown in FIG. 16.

Referring to FIG. 17, it is recognized that the As concentration of $4 \sim 6 \times 10^{18}$ $cm^{-3}$ is achieved in both center part and peripheral parts of the punch-through stopper region 41P.

The results in FIGS. 16 and 17 indicate that it is not preferable to use As in the ion implantation step of FIG. 13M.

Figure 18:
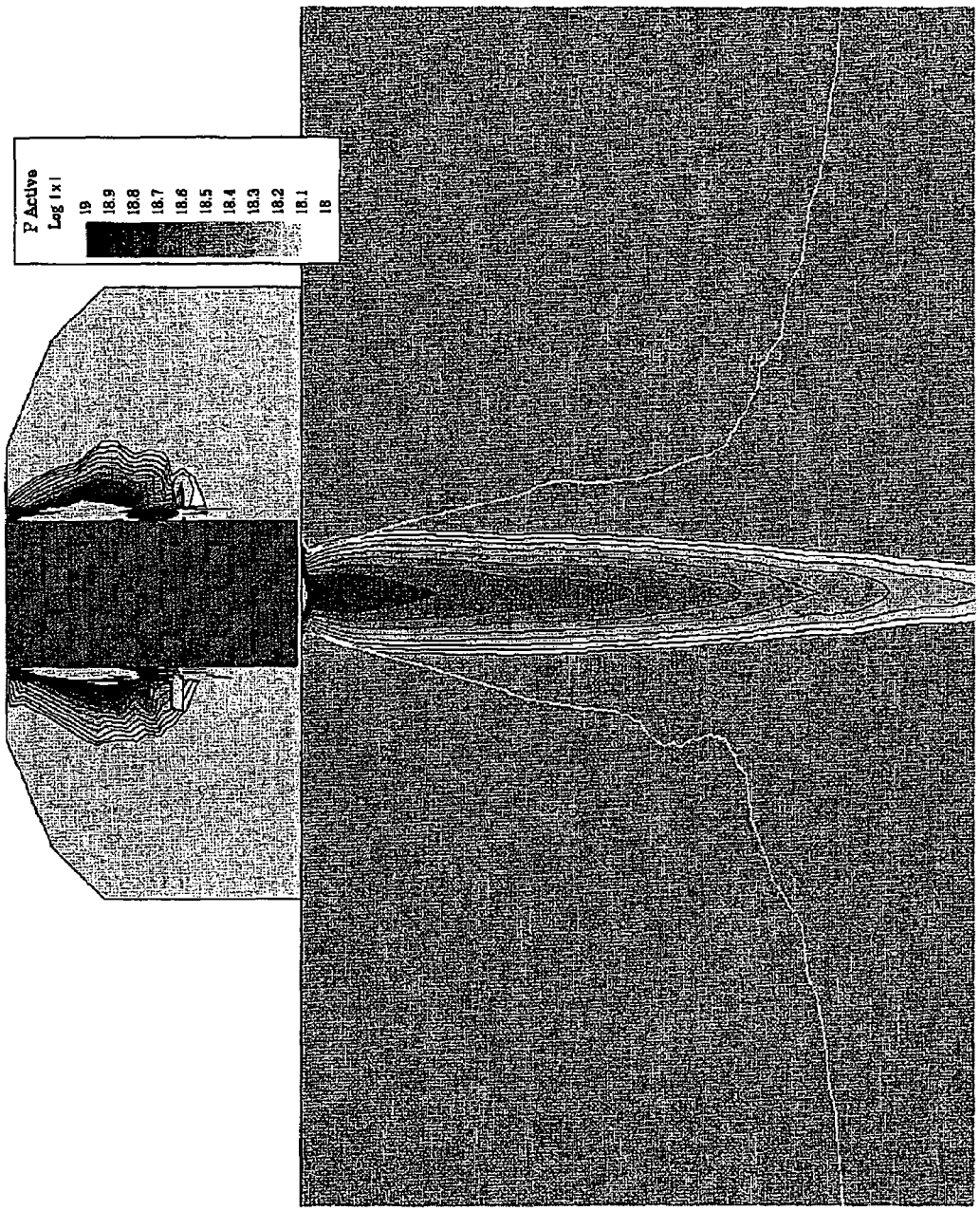
FIG. 18 is a schematic diagram showing the formation of still another punch-through stopper region by ion implantation.

On the other hand, FIG. 18 shows the distribution of P in the punch-through stopper region 41P when P is used as an ion implantation species in the ion implantation step of FIG. 13M, and ion implantation is performed with the dosage of $5 \times 10^{13}$ $cm^{-2}$ under the acceleration voltage of 10 keV at first, and subsequently with the dosage of $2 \times 10^{14}$ $cm^{-2}$ under the acceleration voltage of 30 keV.

As can be seen from FIG. 18, the n-type punch-through stopper region 41P thus formed has the length L that is substantially equal to the width of the mask opening defined by the sidewall insulating film 56A. Also, as in the p-type punch-through stopper region 51P, the n-type punch-through stopper region 41P has a shape extending in the direction perpendicular to the principal surface of the Si substrate 41.

Figure 19:
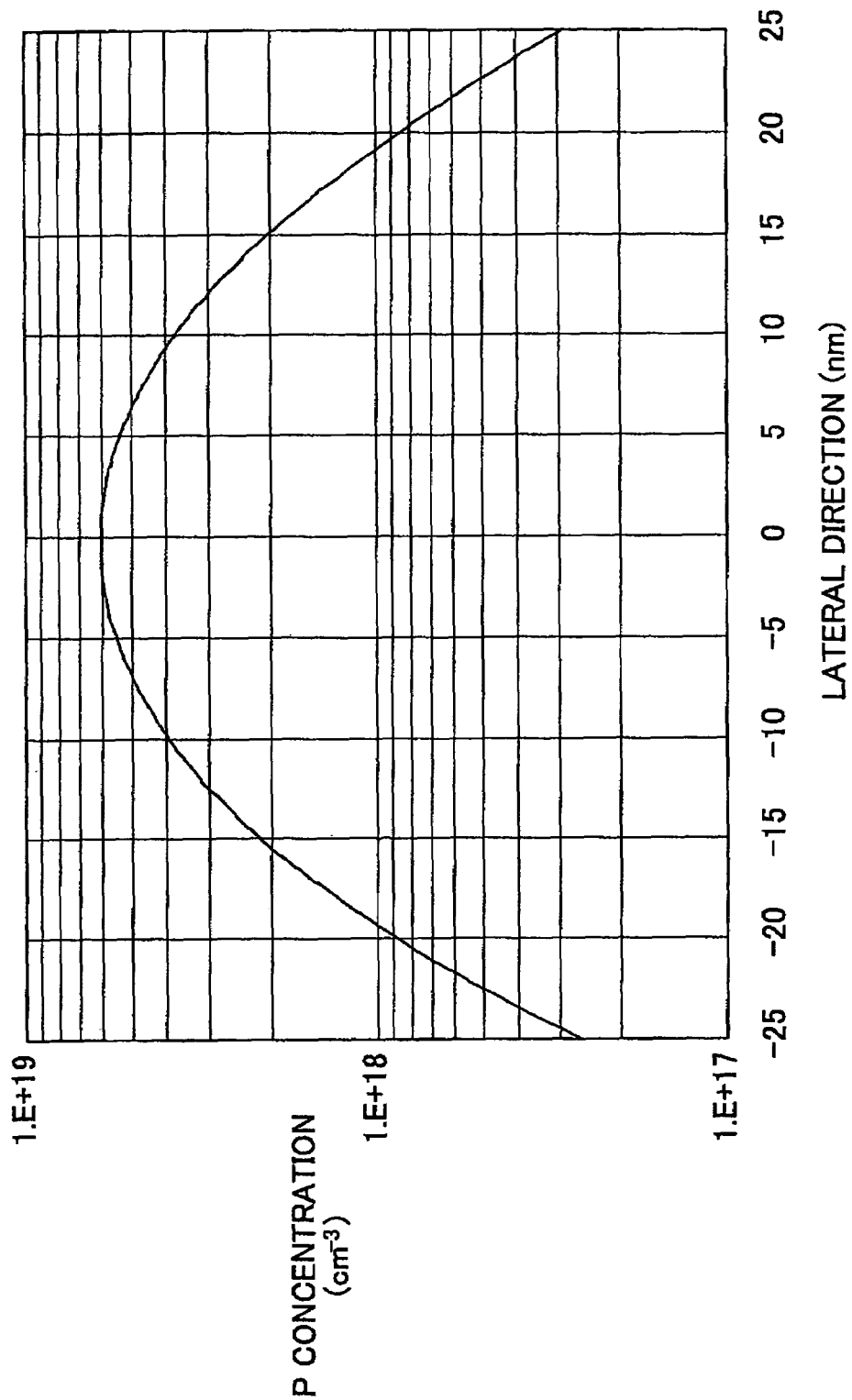
FIG. 19 is a graph showing the formation of the punch-through stopper region by ion implantation.

FIG. 19 shows the distribution of P atoms in a surface parallel to the substrate surface in the punch-through stopper region 41P shown in FIG. 18.

Referring to FIG. 19, in the center part of the punch-through stopper region 41P, P concentration of approximately $6 \times 10^{18}$ cm$^{-3}$ is realized. On the other hand, at the positions distant from the center for 25 nm, the P concentration is decreased down to approximately $3 \times 10^{17}$ cm$^{-3}$. Accordingly, it is recognized that the concentration ratio of the center part equal to or more than ten times, at least twenty times, the concentration ratio of the peripheral parts is achieved.

As described above, it is possible to form a punch-through stopper region satisfying the conditions explained in advance in FIG. 7 through 11 by performing ion implantation of B in the step of FIG. 13L and ion implantation of P in the step of FIG. 13M such that the ion implantation is performed more than once in each of the steps while varying the acceleration voltage.

Figure 20A:
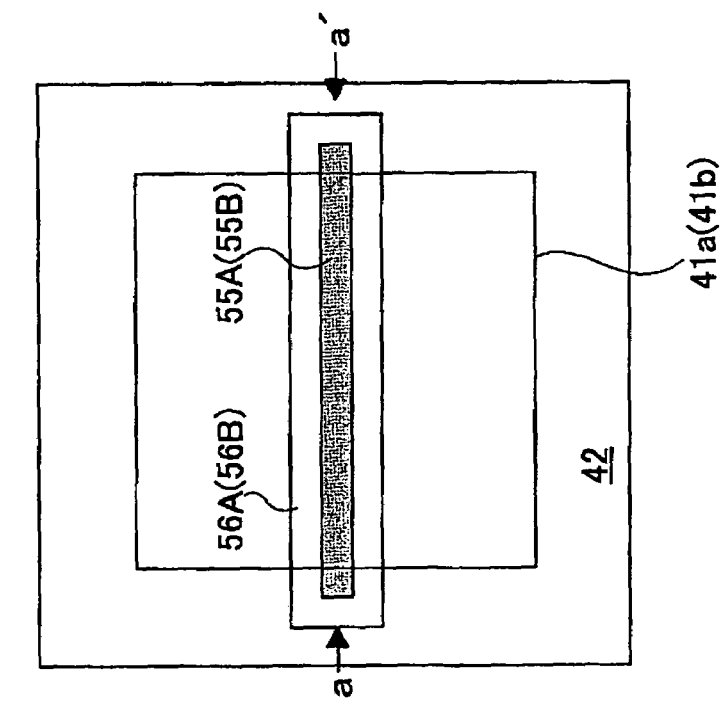
FIG. 20A is a plan view showing a mask used when forming a punch-through stopper region by ion implantation.
Figure 20B:
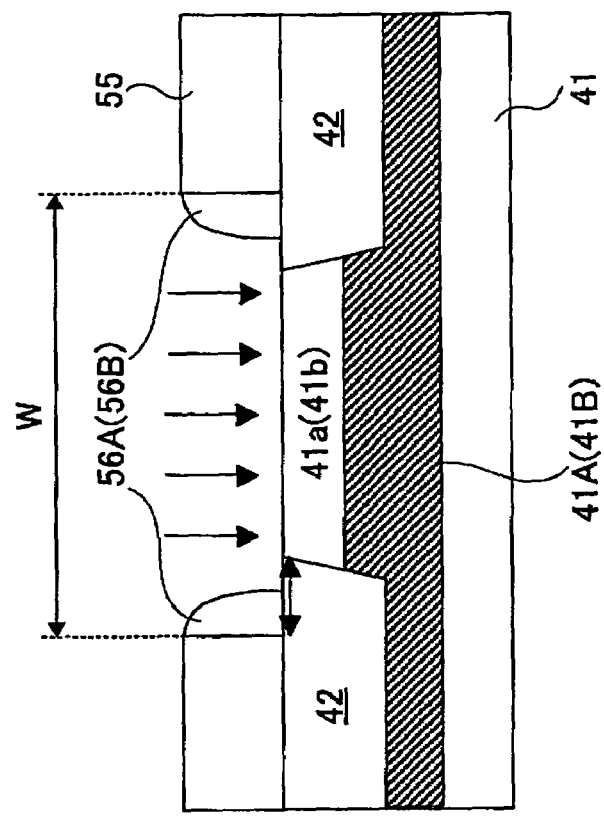
FIG. 20B is a cross-sectional view showing the mask used when forming the punch-through stopper region by ion implantation.

FIGS. 20A and 20B are a plan view and a cross-sectional view, respectively, corresponding to the construction shown in FIG. 13K.

Referring to FIGS. 20A and 20B, the concave portion 55A or 55B extends with a width W that exceeds the width of the device region 41a or 41b defined by the device isolation structure 42. As a result, ion implantation for forming the punch-through stopper region 41P or 51P in the step of FIG. 13L or FIG. 13M is performed to the full width of the device region 41a or 41b, respectively. Consequently, in such a semiconductor device, punch-through using the peripheral parts of the device region as pathways does not occur.

Second Embodiment

Figure 21:
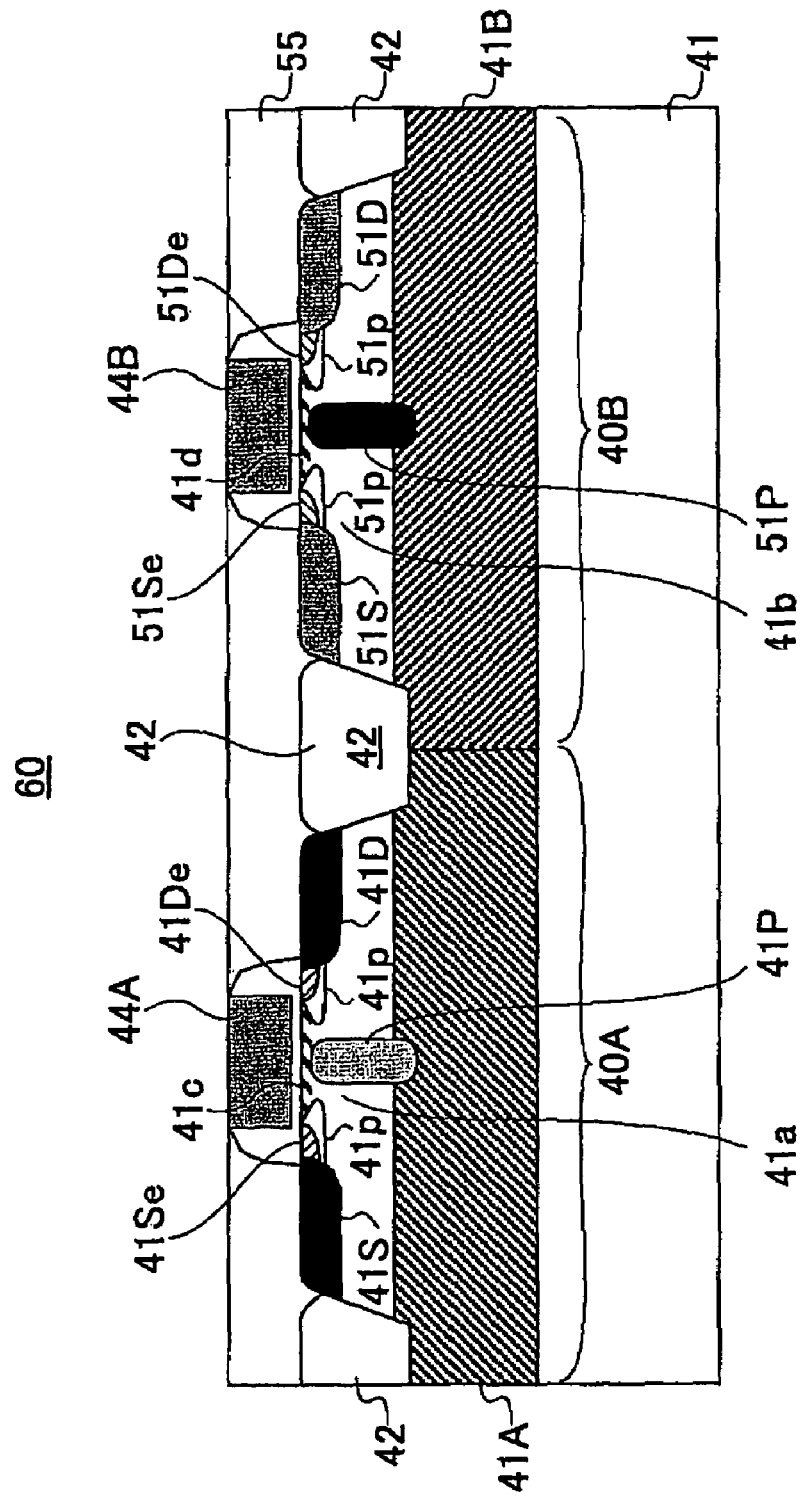
FIG. 21 is a schematic diagram showing the construction of a CMOS integrated circuit device according to a second embodiment of the present invention.

FIG. 21 shows the construction of a CMOS integrated circuit device 60 according to a second embodiment of the present invention. It should be noted that, in FIG. 21, those parts corresponding to the parts described previously are designated by the same reference numerals, and a description thereof will be omitted.

Referring to FIG. 21, in this embodiment, the punch-through stopper region 41P is formed in the device region 40A such that the bottom of the punch-through stopper region 41P reaches the n-type well 41A. Also, the punch-through stopper region 51P is formed in the device region 40B such that the bottom of the punch-through stopper region 51P reaches the p-type well 41B.

Additionally, in the CMOS integrated circuit 60, a channel-doped region 41c corresponding to the gate electrode 44A is formed on the substrate surface in the n-type channel region 41a. Similarly, in the p-type channel region 41b, a channel-doped region 41d corresponding to the gate electrode 44B is formed on the substrate surface. By forming the channel-doped regions 41c and 41d, threshold values of the p-channel MOS transistor formed in the device region 40A and the n-channel MOS transistor formed in the device region 40B are controlled.

Further, in the CMOS integrated circuit device 60, in the channel region 41a, n-type pocket regions 41p are formed as extending parts extending from under the source extension region 41Se and the drain extension region 41De by oblique ion implantation of As+ into the source extension region 41Se and the drain extension region 41De. Similarly, in the channel region 41b, p-type pocket regions 51p are formed as extending parts extending from under the source extension region 51Se and the drain extension region 51De by oblique ion implantation of B+ into the source extension region 51Se and the drain extension region 51De. By forming such pocket regions 41P and 51P, short channel effect is controlled.

In this embodiment, as in the previous embodiment, the punch-through stopper region 41P is formed in the device region 40A such that the punch-through stopper region 41P reaches the n-type well 40A. Also, the punch-through stopper region 51P is formed in the device region 40B such that the punch-through stopper region 51P reaches the p-type well 40B. Hence, in the n-type channel region 41a, a current path connecting the p-type source region 41S side and the p-type drain region 41D side is cut off. Similarly, in the p-type channel region 41b, a current path connecting the n-type source region 51S side and the n-type drain region 51D side is cut off. Consequently, in the device region 40A, a lateral bipolar transistor formed by the channel region 41a, the source region 41S and the drain region 41D is prevented from turning ON. Additionally, also in the device region 40B, the channel region 41b, the source region 51S and the drain region 51D are prevented from turning ON. Hence, latch-up in CMOS circuits to which the lateral bipolar transistor relates is effectively controlled.

Further, in this embodiment, the punch-through stopper region 41P reaches the n-type well 41A and the punch-through stopper region 51P reaches the p-type well 41B. However, it is not necessary that the punch-through stopper regions 41P and 51P exactly reach the n-type well 41A and the p-type well 41B, respectively. Similar effects can be obtained when the bottom of the punch-through stopper region 41P is sufficiently close to the n-type well 41A and the bottom of the punch-through stopper region 51P is sufficiently close the p-type well 41B.

Moreover, as in the previous embodiment, by making the depth of the top of the punch-through stopper region 41P or 51P equal to or less than 10 nm and the length L equal to or more than 10 nm, it is possible to control short channel effect (punch-through). Also, by making the substrate impurity concentration ratio equal to or more than five to one, it is possible to decrease the junction capacitance. Accordingly, it is possible to obtain a CMOS integrated circuit device that operates at ultra-high speed.

Third Embodiment

Next, referring to FIGS. 22A through 22I, a description will be given of the manufacturing method of a CMOS integrated circuit device according to a third embodiment of the present invention. It should be noted that in FIGS. 22A through 22I, those parts that are explained previously are designated by the same reference numerals, and a description thereof will be omitted.

In this embodiment, the structure previously shown in FIG. 13K is formed in the step of FIG. 22A. In the step of FIG. 22B, dry etching is performed on the Si substrate 41 using the SiO2 film 55 and the sidewall films 56A and 56B as a mask so that a groove 41Q is formed in the channel region 41a with a depth deeper than the junction depth of the source region 41S or the drain region 41D, and preferably with a depth to reach the n-type well 41A, and a groove 51Q is formed in the channel region 41b with a depth deeper than the junction depth of the source region 51S or the drain region 51D, and preferably with a depth to reach the p-type well 41B.

Figure 22C:
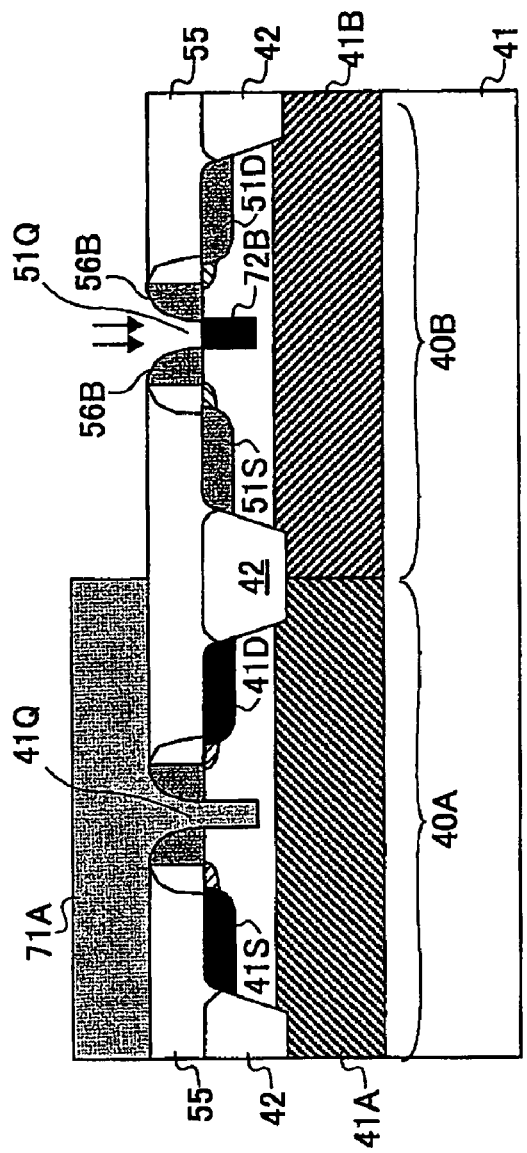
Figure 22D:
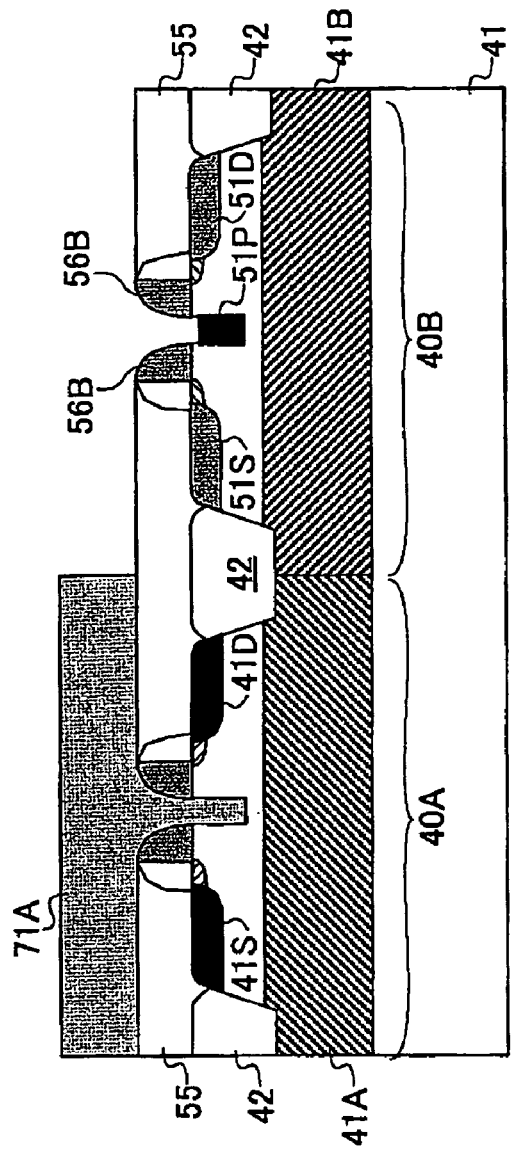

Next, in the step of FIG. 22C, an insulating film pattern 71A of an organic solvent, for example, corresponding to the device region 40A, is formed on the insulating film 55 such that the insulating film 71 fills in the groove 41Q.

Then, in the step of FIG. 22C, in the device region 40B, a p-type Si region 72B is epitaxially grown again in the groove 51Q. Further, in the step of FIG. 22D, the Si region 72B is slightly etched so as to form the p-type punch-through stopper region 51P.

Figure 22E:
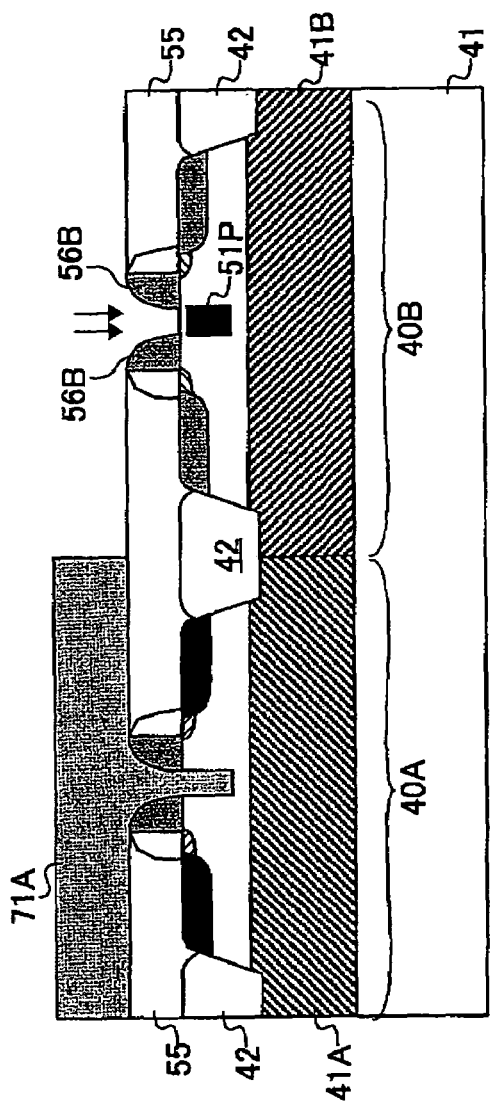

Additionally, in the step of FIG. 22E, a Si layer of low dopant (n-type) concentration is formed on the surface of the punch-through stopper region 51P by an epitaxial process.

Figure 22F:
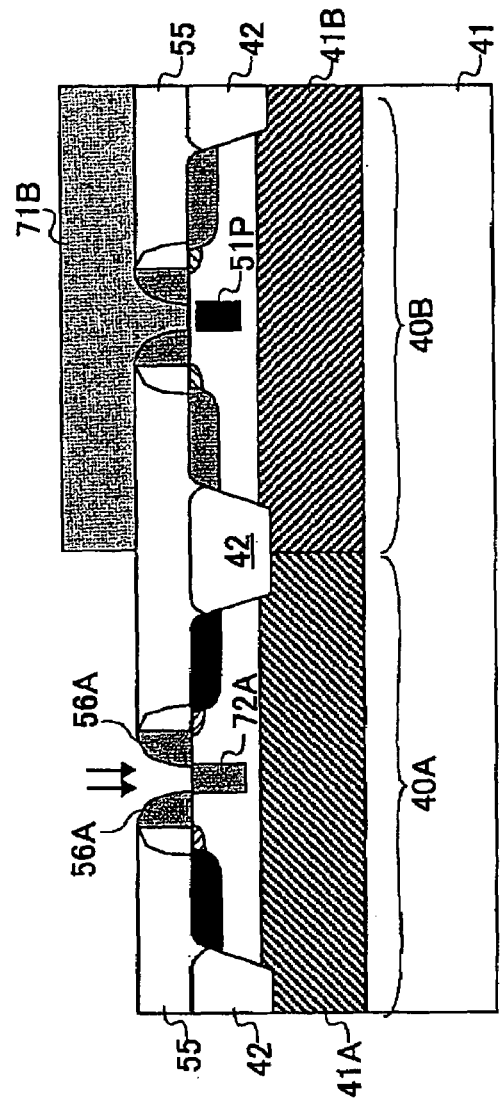

Similarly, in the step of FIG. 22F, the insulating film pattern 71A is removed, and an insulating film pattern 71B of an organic solvent, for example, corresponding to the device region 40B, is formed on the insulating film 55.

Figure 22G:
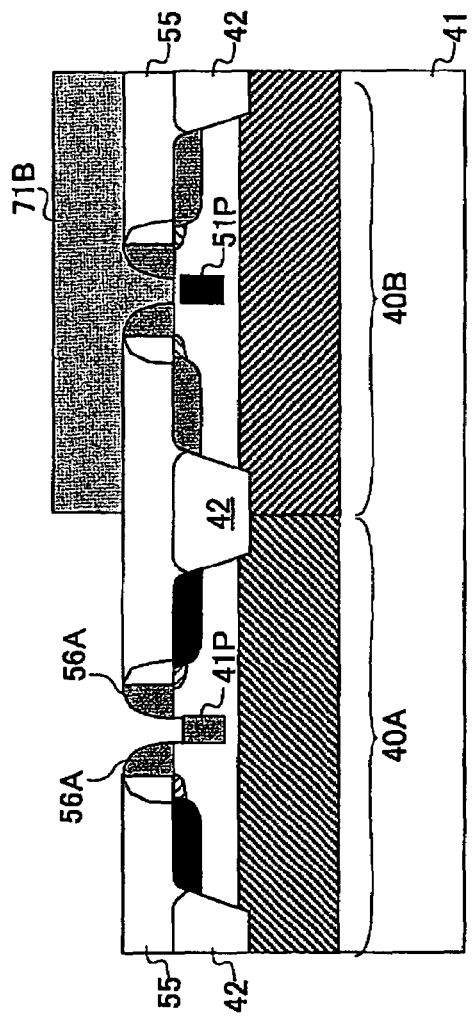

Further, in the state shown in FIG. 22F, in the device region 40A, an n-type Si region 72 is epitaxially grown again in the groove 41Q. In the step of FIG. 22G, the Si region 72A is slightly etched so as to form the p-type punch-through stopper region 41P.

Figure 22H:
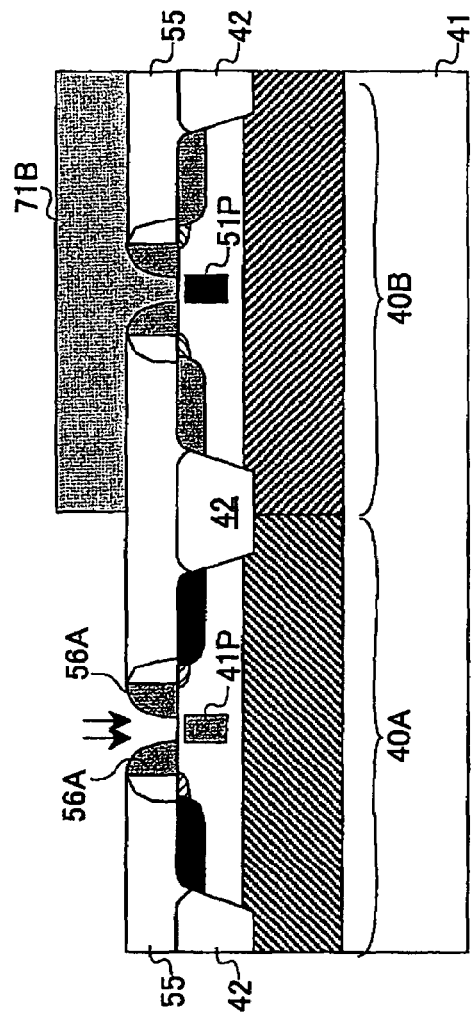

Then, in the step of FIG. 22H, a Si layer of low dopant (p-type) concentration is formed on the surface of the punch-through stopper region 41P by an epitaxial process.

Figure 22I:
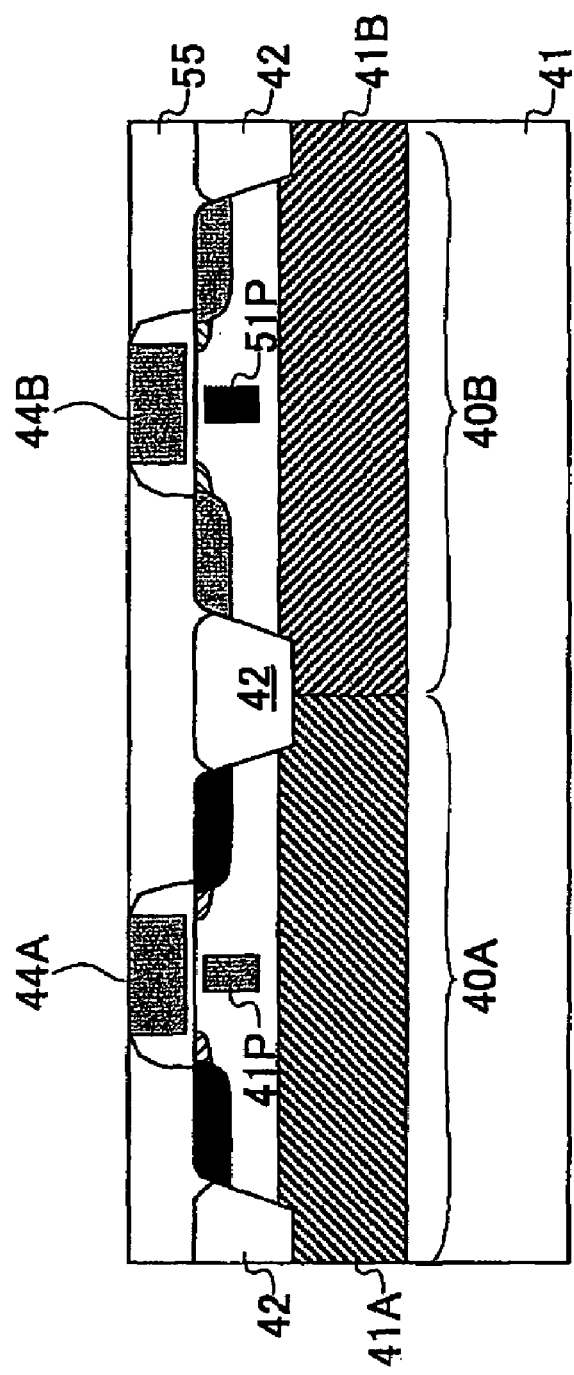

In addition, in the step of FIG. 22I, the insulating pattern 71B is removed, and further, the sidewall insulating films 56A and 56B are removed. Further, a thermal oxide film is formed on the silicon surface thus exposed in both of the device regions 40A and 40B as respective gate insulation films of the p-channel MOS transistor and n-channel MOS transistor. Further, the gate electrodes 44A and 44B are formed in the concave portions formed in the insulating film 55 so as to correspond to the device regions 40A and 40B, respectively.

According to this embodiment, it is possible to form the punch-through stopper regions 41P and 51P with good controllability not by ion implantation but by a selective re-growth process.

Fourth Embodiment

Figure 23:
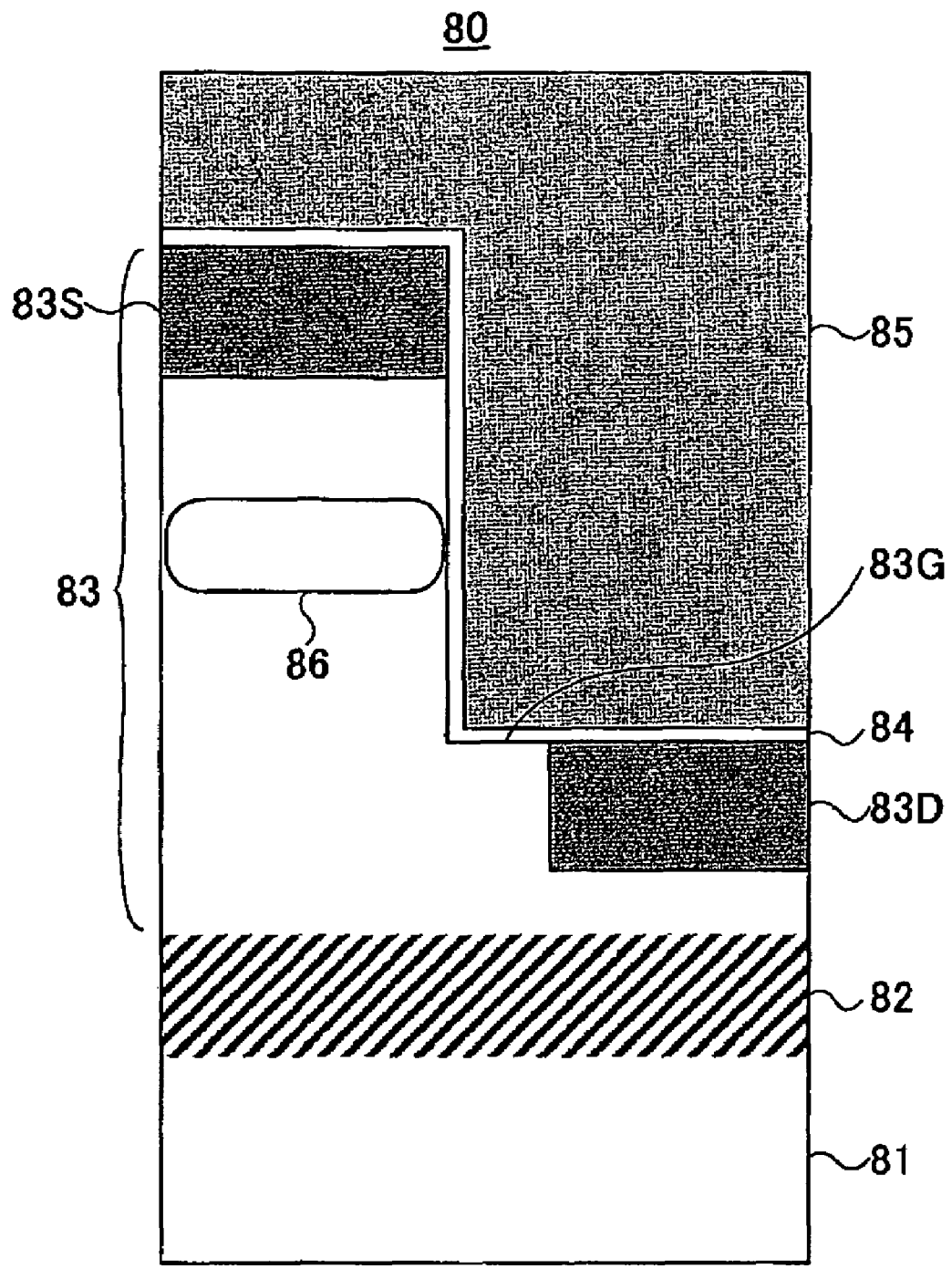
FIG. 23 is a schematic diagram showing the construction of a semiconductor device according to a fourth embodiment of the present invention.

FIG. 23 shows the construction of a MOS transistor according to a fourth embodiment of the present invention.

Referring to FIG. 23, a MOS transistor 80 is formed on a p-type Si substrate 81, for example, and includes a p-type well 82 formed on the Si substrate 81 and a p− type layer 83 used as a channel region and formed on the p-type well 82. Additionally, an n+ type diffusion region 83S, which is used as a source or drain region, is formed in the upper side of the channel region 83.

On the Si substrate 81, a trench 83G is further formed in the channel region 83 so as to cut the diffusion region 83S. An n+type diffusion region 83D, which is used as a source or drain region, is formed at the bottom surface of the trench 83.

Further, a thermally-oxidized film 84 is formed on the surface of the trench 83G as a gate insulating film, and a gate electrode 85 is formed on the gate insulating film 84 so as to fill in the trench 83G. Consequently, in the device region 83, an n-channel type MOS transistor having a channel region that extends in the vertical direction is formed.

In the MOS transistor 80 shown in FIG. 23, a channel is formed between the source region 83S and the drain region 83D along the surface of the trench 83G. In this embodiment, a p-type layer 86 is formed in the channel layer 83 as a punch-through stopper region.

In the construction according to this embodiment, it is possible to form the punch-through stopper region 86 by epitaxial growth when growing the channel layer 83. Thus, it is possible to form an effective punch-through stopper region where the impurity profile is ideally controlled.

Additionally, in this embodiment, it is clear that a p-channel MOS transistor can be formed by inverting the conductivity type.

The present invention is not limited to the specifically disclosed embodiments, and variations and modifications may be made without departing from the scope of the present invention.

What is claimed is:

1. A manufacturing method of a semiconductor device, comprising the steps of:

forming a dummy gate electrode on a surface of a semiconductor substrate so as to correspond to a channel region;

forming a source region and a drain region by introducing an impurity element of a first conductivity type into said semiconductor substrate using said dummy gate electrode as a mask;

forming an insulating film on the surface of said semiconductor substrate so as to cover said dummy gate electrode;

polishing said insulating film until said dummy gate is exposed;

removing said dummy gate electrode and forming an opening in said insulating film;

forming a sidewall film on a sidewall surface of said opening; and forming a punch-through stopper region extending in a direction perpendicular to the surface of said semiconductor substrate by performing ion implantation of an impurity element of a second conductivity type into said semiconductor substrate at least twice with different acceleration voltages using said insulating film and said sidewall film as a mask, wherein the step of forming said punch-through stopper region is performed later than the step of forming said source region and said drain region, wherein, in the semiconductor substrate, a well of the second conductivity type is formed at a distance from the surface of the semiconductor substrate, the source region and the drain region are formed above said well of the second conductivity type at a distance from said well of the second conductivity type in the step of forming the source region and the drain region, and the step of forming the punch-through stopper region is performed such that a bottom of the punch-through stopper region reaches in the vicinity of said well of the second conductivity type.

2. The manufacturing method of the semiconductor device as claimed in claim 1, wherein the step of forming the punch-through stopper region uses one of B and P as the impurity element of the second conductivity type.

3. A manufacturing method of a semiconductor device, comprising the steps of:

forming a dummy gate electrode on a surface of a semiconductor substrate so as to correspond to a channel region;

forming a source region and a drain region by introducing an impurity element of a first conductivity type into said semiconductor substrate using said dummy gate electrode as a mask;

forming an insulating film on the surface of said semiconductor substrate so as to cover said dummy gate electrode;
polishing said insulating film until said dummy gate is exposed;
removing said dummy gate electrode and forming an opening in said insulating film;
forming a sidewall film on a sidewall surface of said opening; and
forming a punch-through stopper region extending in a direction perpendicular to the surface of said semiconductor substrate by performing ion implantation of an impurity element of a second conductivity type into said semiconductor substrate at least twice with different acceleration voltages using said insulating film and said sidewall film as a mask,
wherein the step of forming said punch-through stopper region is performed later than the step of forming said source region and said drain region,
wherein the step of forming the source region and the drain region further comprises the steps of:

forming a source extension region and a drain extension region of the first conductivity type in upper parts of the source region and the drain region, respectively, such that the source extension region and the drain extension region extend along the surface of the semiconductor substrate in a mutually opposing manner; and
forming, by performing ion implantation of an impurity element of the first conductivity type in an oblique direction using the dummy gate electrode as a mask, a first pocket region of the second conductivity type in a lower part of said source extension region and a second pocket region of the second conductivity type in a lower part of said drain extension region such that the first and second pocket regions extend in a mutually opposing manner.

4. The manufacturing method of the semiconductor device as claimed in claim 3, wherein the step of forming the punch-through stopper region uses one of B and P as the impurity element of the second conductivity type.

* * * * *